US007719351B2

(12) United States Patent
Pertijs et al.

(10) Patent No.: US 7,719,351 B2
(45) Date of Patent: *May 18, 2010

(54) AUTOZEROING CURRENT FEEDBACK INSTRUMENTATION AMPLIFIER

(75) Inventors: Michiel Pertijs, Delft (NL); George Reitsma, Noordwijk (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/804,492

(22) Filed: May 17, 2007

(65) Prior Publication Data

US 2008/0284507 A1    Nov. 20, 2008

(51) Int. Cl.
*H03F 1/02* (2006.01)
(52) U.S. Cl. .......................................... 330/9; 327/124
(58) Field of Classification Search ................ 330/9, 330/124 R, 295; 327/124, 307
See application file for complete search history.

(56) References Cited

U.S. PATENT DOCUMENTS

| 5,155,447 | A | 10/1992 | Huijsing et al. |
| 6,538,503 | B2 | 3/2003 | Burt |
| 7,132,883 | B2 * | 11/2006 | Huijsing et al. ................ 330/9 |
| 2005/0275460 | A1 | 12/2005 | Botker |
| 2006/0176109 | A1 | 8/2006 | Huijsing et al. |

OTHER PUBLICATIONS

C.C. Enz and G.C. Temes, "Circuit Techniques for Reducing the Effects of Op-Amp Imperfections: Autozeroing, Correlated Double Sampling, and Chopper Stabilization", Proceedings of the IEEE, vol. 84, No. 11, Nov. 1996, pp. 1584-1614.

B.J. van den Dool and J. H. Huijsing, "Indirect Current Feedback Instrumentation Amplifier with a Common-Mode Input Range that Includes the Negative Rail", IEEE Journal of Solid-State Circuits, vol. 28, No. 7, Jul. 1993, pp. 743-749.

A.P. Brokaw and M.P. Timko, "An Improved Monolithic Instrumentation Amplifier", IEEE Journal of Solid-State Circuits, vol. SC-10, No. 6, Dec. 1975, pp. 417-423.

R.C. Yen and P.R. Gray, "A MOS Switched-Capacitor Instrumentation Amplifier", IEEE Journal of Solid-State Circuits, vol. SC-17, No. 6, Dec. 1982, pp. 1008-1013.

(Continued)

*Primary Examiner*—Robert Pascal
*Assistant Examiner*—Hieu P Nguyen

(57) ABSTRACT

An embodiment is directed to an instrumentation amplifier. The instrumentation amplifier includes an output stage for generating an output voltage, a low-frequency path coupled with the output stage, and a high-frequency path coupled with the output stage. The high-frequency path dominates the low-frequency path at frequencies above a particular frequency, and the low-frequency path dominates the high-frequency path at frequencies below the particular frequency. The low-frequency path includes an input stage for sensing a differential input and generating an intermediate current based thereon, a feedback stage coupled with the input and output stages, the feedback stage for generating a feedback current based on the output voltage, and an auto-zeroing circuit coupled with the input, feedback, and output stages, the auto-zeroing circuit for generating a nulling current. The nulling current compensates for errors in the intermediate and feedback currents resulting from input offsets in the input and feedback stages.

18 Claims, 16 Drawing Sheets

OTHER PUBLICATIONS

R.G.H. Eschauzier, J.H. Huijsing, "Frequency Compensation Techniques for Low-Power Amplifiers", Kluwer Academic Publishers, Boston 1995, pp. 152-162.

Non-Final Office Action date mailed Oct. 21, 2008; U.S. Appl. No. 11/804,490.

Notice of Allowance date mailed Mar. 30, 2009; U.S. Appl. No. 11/804,490.

Gift, Stephan J.G., An Enhanced Current-Mode Instrumentation Amplifier, IEEE Transactions On Instrumentation And Measurement, vol. 50, No. 1, Feb. 2001, pp. 85-88.

* cited by examiner

1625A

AUTOZEROING CURRENT FEEDBACK INSTRUMENTATION AMPLIFIER

REFERENCE TO CO-PENDING APPLICATIONS FOR PATENT

The present Application for Patent is related to co-pending U.S. patent application Ser. No. 11/804,490, now U.S. Pat. No. 7,573,327, entitled "AUTOZEROING CURRENT FEEDBACK INSTRUMENTATION AMPLIFIER", by Michiel Pertijs et al., filed May 17, 2007, assigned to the assignee hereof, and expressly incorporated by reference herein.

BACKGROUND

1. Field

Embodiments generally relate to the field of current feedback instrumentation amplifiers.

2. Background

Instrumentation amplifiers are commonly used to amplify small differential input voltages while rejecting common-mode input voltages. A desired feature of such amplifiers is a low input-referred offset voltage combined with a low input current. The latter can be achieved by using a MOS input stage, but such an input stage typically results in a high offset voltage.

Another desired feature of instrumentation amplifiers is that their input range includes the negative supply rail, so that they can be connected to a grounded signal source in a single-supply system. This is not possible with a conventional 3-opamp instrumentation amplifier topology.

This limitation to some extent has been overcome by using a current-feedback topology with PMOS input transistors. The PMOS transistors transfer the differential input voltage to a resistor connected between their sources, resulting in a current proportional to the differential input voltage. The PMOS transistors at the same time provide the required common-mode level-shift to be able to make this voltage-to-current conversion with an input voltage at ground level. In the rest of the amplifier, the generated current is converted back into an output voltage using a second resistor.

FIG. 1 shows a block diagram of one conventional current-feedback instrumentation amplifier 100. The differential input voltage $V_{in}$ is converted to a current by transconductance amplifier $g_2$. As described above, amplifier $g_2$ has PMOS input transistors which enable it to sense input signals at the negative supply rail. The difference between the output voltage $V_{out}$ and a reference voltage $V_{ref}$ is scaled down by a resistive divider, consisting of $R_1$ and $R_2$, to provide a feedback voltage $V_{fb}$. This is applied to a second transconductance amplifier $g_3$. The feedback loop, closed by the output stage $g_1$, ensures that the output current of $g_3$ equals that of $g_2$. It is appreciated that the output stage, here shown as a single Miller-compensated transconductance stage, can in practice consist of multiple stages. If the two transconductances $g_2$ and $g_3$ are equal, $V_{fb}$ equals $V_{in}$, and therefore the output voltage equals:

$$V_{out}=V_{ref}+(R_1+R_2)/R_2 \cdot V_{in} \qquad (1)$$

In the more general case that the two transconductances are not equal, the output voltage equals:

$$V_{out}=V_{ref}+g_2/g_3 \cdot (R_1+R_2)/R_2 \cdot V_{in} \qquad (2)$$

In addition to its ability to sense input voltages at the negative supply rail, amplifier 100 has the attractive feature that its output can swing rail-to-rail, which is important in low-voltage applications.

However, circuit 100 is disadvantageous in that the offsets of transconductance amplifiers $g_2$ and $g_3$ add directly to the input voltage, and therefore need to be compensated for. FIG. 2 illustrates one conventional amplifier 200 that employs chopper switches 210 and 220 added at the input of $g_2$ and $g_3$ to periodically reverse the polarity of the input and feedback signal. An additional chopper switch 230 at the input of the output stage restores the original polarity. This configuration effectively modulates the offset of the transconductance amplifiers to the chopper frequency, where it can, in principle, be filtered out.

An important disadvantage of using chopping to eliminate the offset in current-feedback instrumentation amplifiers is that the modulated offset results in spurious AC signals at the output of the amplifier 200. For example, the output of amplifier 200 may actually appear as a sawtooth signal. Since the output of an instrumentation amplifier is typically sampled by an analog-to-digital converter, such spurious signal may result in measurement errors unless they are filtered out. Conventional implementations have attempted to reduce and filter these spurious signals by using a continuous (non-chopped) feedforward path and various extra offset-compensation loops. This, however, leads to a very large and complex system.

Another important disadvantage of using chopping is that the input source is exposed to a switched capacitive load consisting of the input capacitance $C_{in2}$ of transconductance amplifier $g_2$. Due to the periodic polarity reversal, this input capacitance has to be alternately charged to $+V_{in}$ and $-V_{in}$. The associated current results in an input offset current. Effectively, this reduces the input impedance of the instrumentation amplifier (e.g., amplifier 200) to:

$$R_{in}=1/(2 \cdot f_{chop} \cdot C_{in2}). \qquad (3)$$

For typical values of $f_{chop}$=10 kHz and $C_{in2}$=1 pF, the input impedance is 50 MΩ. In contrast, non-chopped instrumentations amplifiers with MOS inputs typically achieve input impedances on the order of 10 GΩ. This reduced impedance due to chopping can cause significant gain errors when reading out a high-impedance signal source. A similar problem occurs at the input of transconductance amplifier $g_3$, whose input capacitance $C_{in3}$ presents a switched load to the feedback network.

Thus, conventional current feedback instrumentation amplifiers do not provide a simple way to reduce input offsets while at the same time maintaining high input impedance and avoiding spurious signals at the output.

SUMMARY

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

An embodiment is directed to an instrumentation amplifier. The instrumentation amplifier includes an output stage for generating an output voltage, a low-frequency path coupled with the output stage, and a high-frequency path coupled with the output stage. The high-frequency path dominates the low-frequency path at frequencies above a particular frequency, and the low-frequency path dominates the high-frequency path at frequencies below the particular frequency. The low-frequency path includes an input stage for sensing a differential input and generating an intermediate current based thereon, a feedback stage coupled with the input and output stages, the feedback stage for generating a feedback current based on the output voltage, and an auto-zeroing circuit coupled with the input, feedback, and output stages, the auto-zeroing circuit for generating a nulling current. The nulling current compensates for errors in the intermediate and feedback currents resulting from input offsets in the input and feedback stages.

Thus, embodiments provide technology allowing for instrumentation amplifiers with very low input-referred offset, low input current, and low level spurious switching signals at the output. Additionally, spurious signals may be further reduced by adding a high-frequency feedforward path.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Overview

Generally speaking, embodiments provide technology for reducing input offsets in current feedback instrumentation amplifiers. The technology involves using auto-zeroing circuitry to null an offset of an input stage. In one embodiment, this is achieved by periodically switching-in the auto-zeroing circuitry. As a result, embodiments are able to achieve very low input-referred offset, low input current, and low-level spurious switching signals at the output. Additionally, spurious signals may be further reduced by adding a high-frequency feedforward path.

Exemplary Circuits, in Accordance with Various Embodiments

Figure 1:
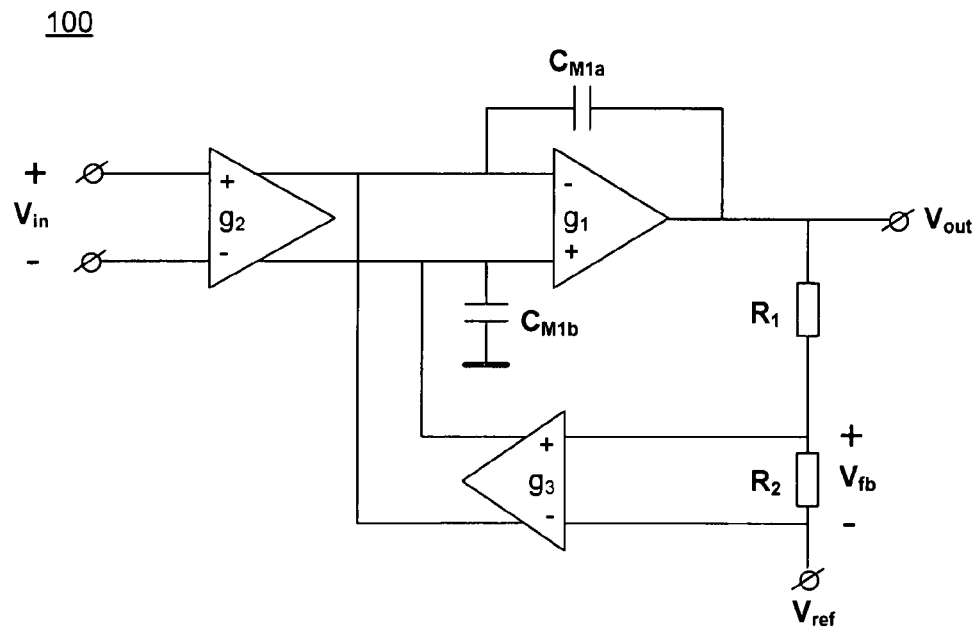
FIG. 1 shows a block diagram of one conventional current-feedback instrumentation amplifier.
Figure 2:
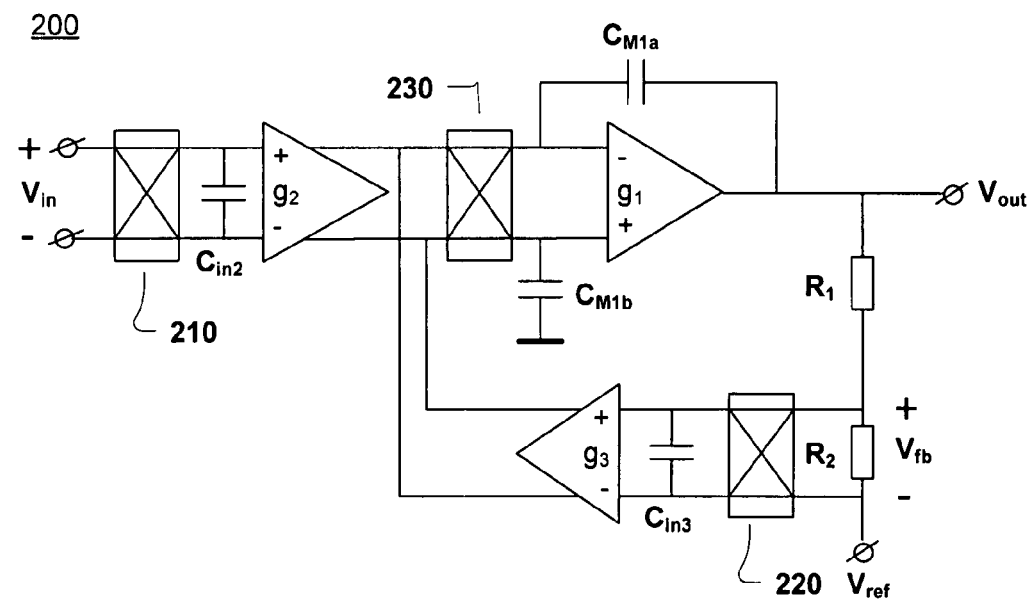
FIG. 2 illustrates one conventional amplifier that employs chopper switches added at the input and output of $g_2$ and $g_3$ from FIG. 1 to modulate the offset of $g_2$ and $g_3$ away from DC.
Figure 3:
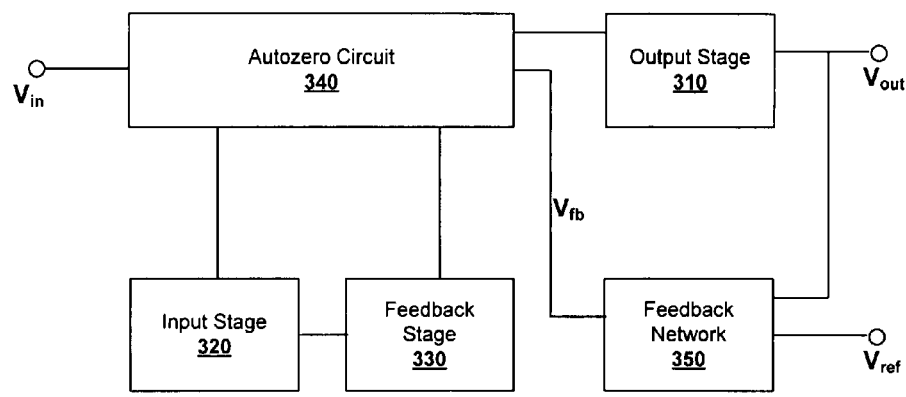
FIG. 3 illustrates a block diagram of a current feedback amplifier, in accordance with various embodiments of the present invention.

FIG. 3 illustrates a block diagram of a current feedback amplifier 300, in accordance with various embodiments of the present invention. Amplifier 300 includes an input stage 320, an output stage 310, a feedback stage 330, and a feedback network 350. The feedback network is operable to generate a feedback voltage $V_{fb}$ from the output voltage $V_{out}$ and the reference voltage $V_{ref}$ and thus defines the gain of the amplifier. The amplifier 300 also advantageously includes an auto-zero circuit 340 coupled to the input stage 320, the output stage 310, and the feedback stage 330. The auto-zero circuit 340 is operable to switch the amplifier 300 between an amplification configuration corresponding to an amplification phase and an auto-zeroing configuration corresponding to an auto-zeroing phase. During the amplification phase, the amplifier 300 is operable to perform normal amplification operations. During the auto-zeroing phase, the auto-zero circuit 340 is operable to null offset currents generated by the input stage 320 and the feedback stage 330.

In one embodiment, the auto-zero circuit 340 nulls the offset currents by shorting inputs of the input stage 320 and the feedback stage 330 to respective common mode voltages. Subsequently, the auto-zero circuit 340 may then measure corresponding offset currents generated by the input stage 320 and the feedback stage 330 and generate a nulling current based thereon. The nulling current serves to compensate for the offset currents generated by the input stage 320 and the feedback stage 330.

When the auto-zero circuit 340 switches the amplifier 300 back to the amplification configuration, the auto-zero circuit 340 continues to generate the nulling current, thereby reducing or even eliminating offsets in the amplifier 300. In one embodiment, the auto-zero circuit 340 periodically switches between amplification and auto-zeroing configurations so as to periodically recalibrate the nulling current.

Figure 4:
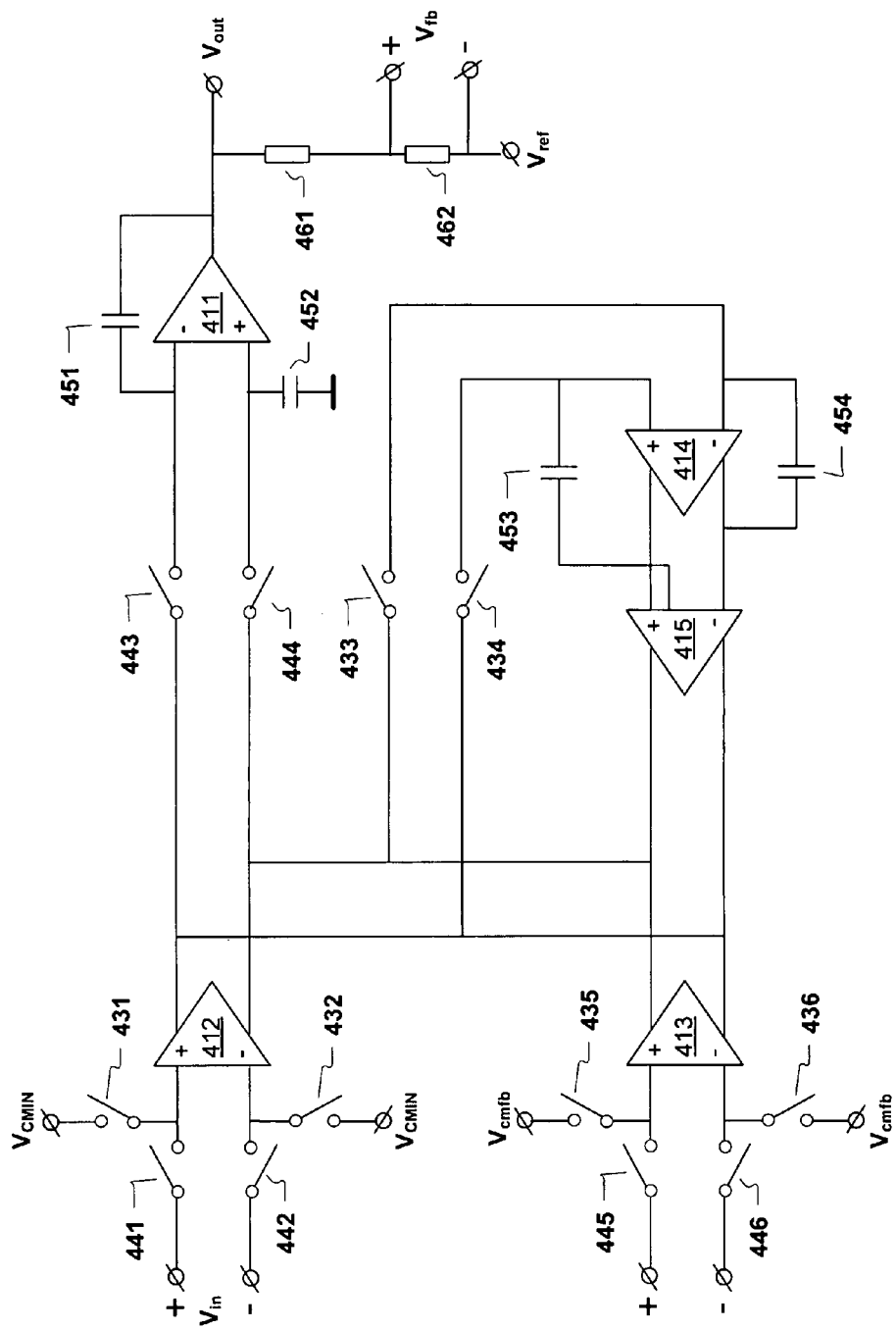
FIG. 4 illustrates a schematic of a current feedback amplifier, in accordance with various embodiments of the present invention.

It should be appreciated that amplifier 300 may be achieved in a number of ways. For example, FIG. 4 illustrates a schematic of a current feedback amplifier 400, in accordance with various embodiments of the present invention. In amplifier 400, tranconductance amplifier 411 serves as an output stage, such as output stage 310 in amplifier 300, tranconductance amplifier 412 serves as an input stage, such as input stage 320 of amplifier 300, tranconductance amplifier 413 serves as a feedback stage, such as feedback stage 330 of amplifier 300, and resistors 461 and 462 serve as feedback network, such as feedback network 350 of amplifier 300. Although embodiments may be described herein with reference to single tranconductance amplifiers, it should be appreciated that embodiments are not limited as such. For example, a cascade of multiple stages with appropriate frequency compensation may be used in place of the single tranconductance amplifier 411 in order to obtain a higher gain. Capacitors 451 and 452 serve as frequency compensators for the tranconductance amplifier 411, thus forming a Miller-compensated output stage. Resistors 461 and 462, together with the reference voltage $V_{ref}$, generate the feedback voltage $V_{fb}$ based on the output voltage $V_{out}$. $V_{fb}$ is fed back as an input to the feedback tranconductance amplifier 413.

Switches 431-436 and 441-446, tranconductance amplifiers 414 and 415, and capacitors 453 and 454 function together as an auto-zero circuit, such as auto-zero circuit 340 of amplifier 300. It should be appreciated that switches 431-436 and 441-446 may be any of a number of devices capable of performing a switching function. In one embodiment, the switches 431-436 and 441-446 serve to switch the amplifier 400 between amplification and auto-zeroing configurations. For example, an amplification configuration may correspond to switches 441-446 being closed and switches 431-436 being open. Conversely, an auto-zeroing configuration may correspond to switches 431-436 being closed and switches 441-446 being open.

During the auto-zeroing phase, the inputs of the tranconductance amplifiers 412 and 413 are respectively shorted to the input common mode voltage $V_{cmin}$ and the feedback common mode voltage $V_{cmfb}$. Any input offsets of amplifiers 412 and 413 cause an offset current that flows into the integrator formed by tranconductance amplifier 414 and capacitors 453 and 454. The output of this integrator then drives the tranconductance amplifier 415 to generate a nulling current, which effectively nulls the offset current.

At the end of the auto-zeroing phase, switches 431-436 open. As a result, the voltage at the output of the integrator around amplifier 414 is held so that amplifier 415 continues nulling the offset current at the outputs of amplifiers 412 and 413.

Subsequently, in the amplification phase, switches 441-446 are closed. $V_{in}$ and $V_{fb}$ are applied to amplifiers 412 and 413, respectively, and the summed output current of amplifiers 412, 413, and 415 is coupled with the output stage (i.e., amplifier 411, etc.). The amplifier 400 then operates similar to a traditional current feedback instrumentation amplifier, except that the nulling current injected by amplifier 415 ensures that the input-referred offset voltages of amplifiers 412-413 do not contribute to the output voltage. Thereafter, in a subsequent auto-zeroing phase, the Miller-compensated output stage formed by amplifier 411 and capacitors 451-452 holds the output voltage while amplifiers 412-413 are auto-zeroed again.

In some instances, the gating of the input signal may result in detection of components of the input signal (including noise) at harmonics of the clock frequency. Such components may mix with the clock signal and be modulated down to baseband. Consequently, this may result in errors and increased noise at the output of amplifiers 300 and 400.

Figure 5:
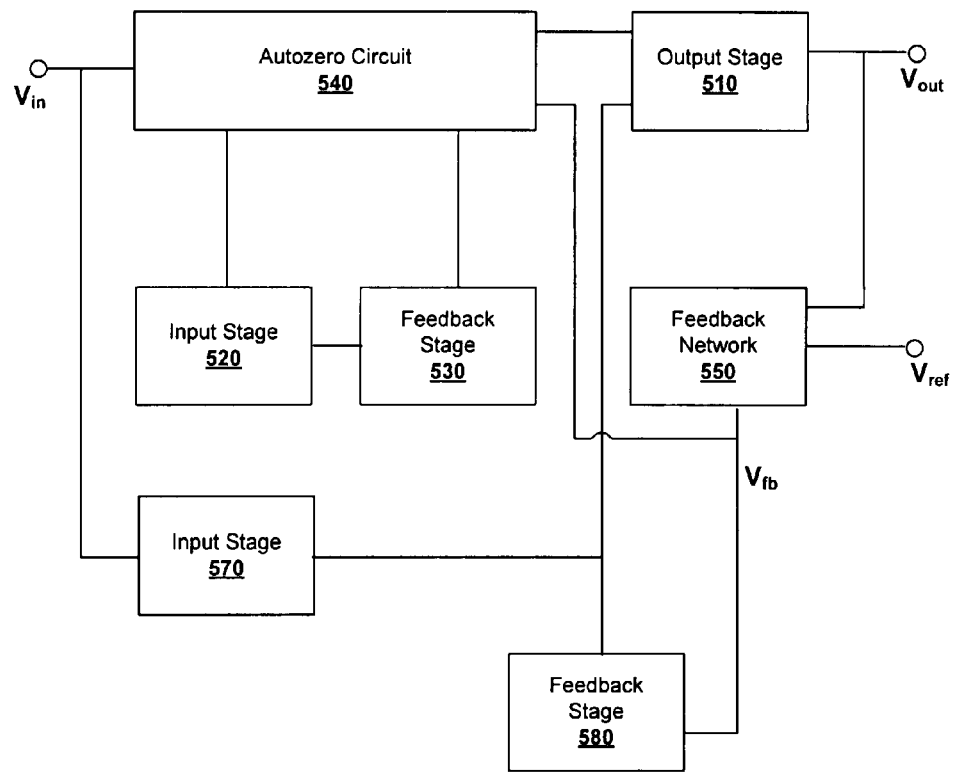
FIG. 5 illustrates a block diagram of a current feedback amplifier, including a high-frequency feedforward path, in accordance with various embodiments of the present invention.

In one embodiment, this mixing may be prevented by using a high-frequency feedforward path. FIG. 5 illustrates a block diagram of a current feedback amplifier 500, including a high-frequency feedforward path, in accordance with various embodiments of the present invention. Amplifier 500 includes input stages 520 and 570, an output stage 510, feedback stages 530 and 580, and a feedback network 550. The amplifier 500 also advantageously includes an auto-zero circuit 540 coupled to the input stage 520, the output stage 510, and the feedback stage 530. The auto-zero circuit 540 is operable to switch the amplifier 500 between an amplification configuration corresponding to an amplification phase and an auto-zeroing configuration corresponding to an auto-zeroing phase. During the amplification phase, the amplifier 500 is operable to perform normal amplification operations. During the auto-zeroing phase, the auto-zero circuit 540 is operable to null offset currents generated by the input stage 520 and the feedback stage 530.

In one embodiment, the auto-zero circuit 540 nulls the offset currents by shorting inputs of the input stage 520 and the feedback stage 530 to respective common mode voltages. Subsequently, the auto-zero circuit 540 may then measure corresponding offset currents generated by the input stage 520 and the feedback stage 530 and generate a nulling current based thereon. The nulling current serves to compensate for the offset currents generated by the input stage 520 and the feedback stage 530.

When the auto-zero circuit 540 switches the amplifier 500 back to the amplification configuration, the auto-zero circuit 540 continues to generate the nulling current, thereby reducing or even eliminating offsets in the amplifier 500. In one embodiment, the auto-zero circuit 540 periodically switches between amplification and auto-zeroing configurations so as to periodically recalibrate the nulling current.

For low frequencies (e.g., below the clock frequency), the auto-zero path comprising input stage 520, feedback stage 530, and auto-zero circuit 540 is dominant, and the amplifier 500 then operates similar to a traditional current feedback instrumentation amplifier, except that the nulling current injected by the auto-zero circuit 540 ensures that the input-referred offsets of input stage 520 and feedback stage 530 do not contribute to the output voltage. Thereafter, in a subsequent auto-zeroing phase, the output stage 510 may hold the output voltage while the input stage 520 and the feedback stage 530 are auto-zeroed again.

At high frequencies, the feedforward path comprising input stage 570 and feedback stage 580 is dominant. Above a threshold frequency, the feedforward path ensures that the feedback signal $V_{fb}$ can track the input signal $V_{in}$. As a result, even if mixing occurs due to the gating at the inputs of input stage 520 and feedback stage 530, the resulting mixing products cancel.

An additional advantage of the feedforward path is that it attenuates switching transients produced by the auto-zeroed input stage. The lower the threshold frequency, the higher the relative gain of the feedforward path at the clock frequency and its harmonics, and therefore the better the attenuation of such switching transients.

Figure 6:
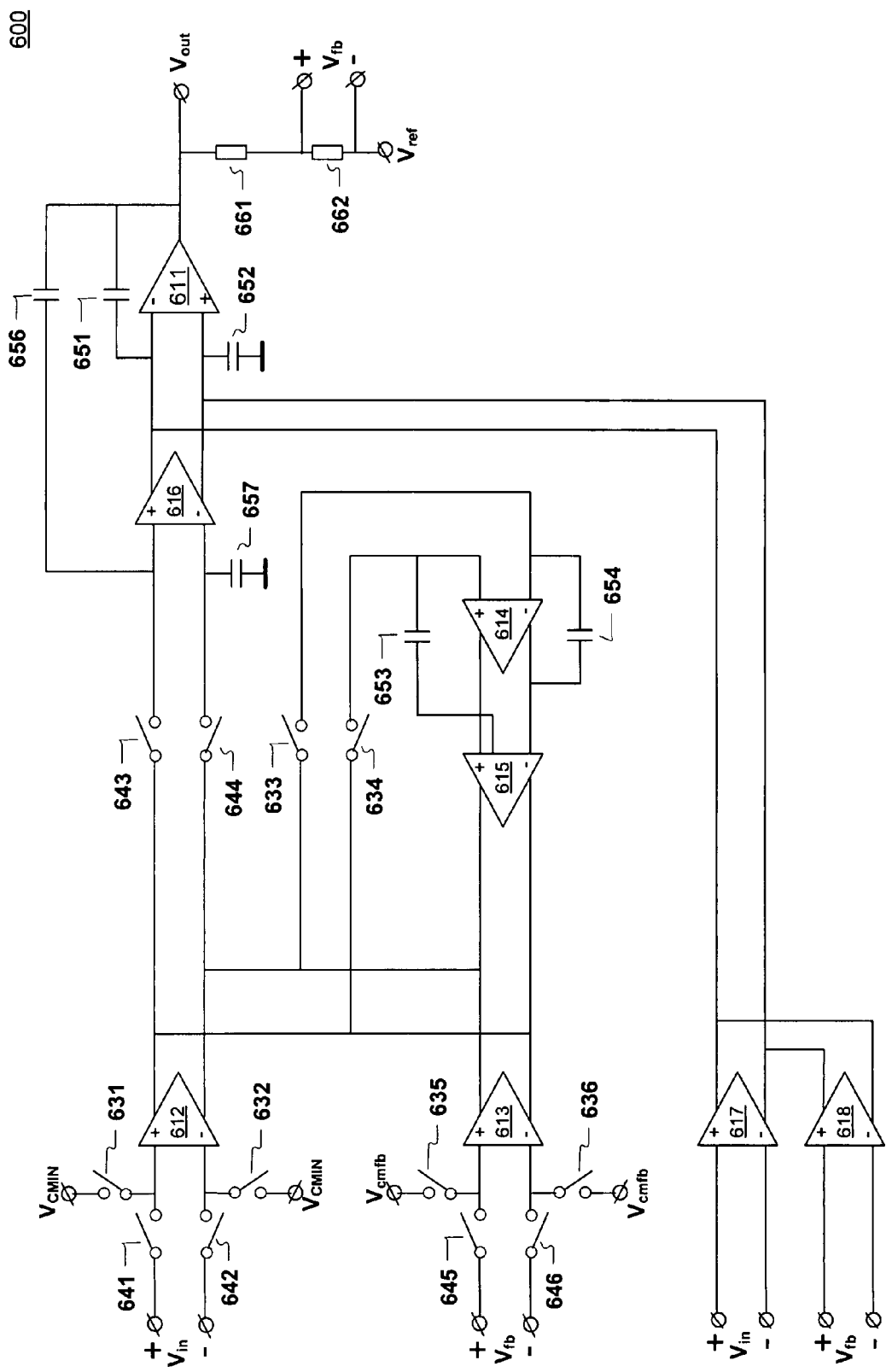
FIG. 6 illustrates a schematic of a current feedback instrumentation amplifier, including a high-frequency feedforward path, in accordance with various embodiments of the present invention.

It is appreciated that amplifier 500 may be achieved in a number of ways. For example, FIG. 6 illustrates a schematic of a current feedback instrumentation amplifier 600, including a high-frequency feedforward path, in accordance with various embodiments of the present invention. In amplifier 600, tranconductance amplifiers 611 and 616 together serve as an output stage, such as output stage 510 of amplifier 500, tranconductance amplifiers 612 and 617 serve as input stages, such as input stages 520 and 570 of amplifier 500, tranconductance amplifiers 613 and 618 serve as feedback stages, such as feedback stages 530 and 580 of amplifier 500, and resistors 661 and 662 together serve as feedback network, such as feedback network 550 of amplifier 500. Capacitors 651 and 652 serve as frequency compensators for the tranconductance amplifier 611, thus forming a nested-Miller-compensated output driver stage. Additionally, tranconductance amplifier 616, along with capacitors 656-657, serves as a Miller-compensated intermediate stage to amplifier 600. Resistors 661 and 662 together with the reference voltage $V_{ref}$ generate the feedback voltage $V_{fb}$ based on the output voltage $V_{out}$. $V_{fb}$ is fed back as an input to the feedback tranconductance amplifiers 613 and 618.

Switches 631-636 and 641-646, tranconductance amplifiers 614 and 615, and capacitors 653 and 654 function together as an auto-zero circuit, such as auto-zero circuit 340 of amplifier 300. It should be appreciated that switches 631-636 and 641-646 may be any of a number of devices capable of performing a switching function. In one embodiment, the switches 631-636 and 641-646 serve to switch the amplifier 600 between amplification and auto-zeroing configurations. For example, an amplification configuration may correspond to switches 641-646 being closed and switches 631-636 being open. Conversely, an auto-zeroing configuration may correspond to switches 631-636 being closed and switches 641-646 being open.

During the auto-zeroing phase, the inputs of the tranconductance amplifiers 612 and 613 are respectively shorted to the input common mode voltage $V_{cmin}$ and the feedback common mode voltage $V_{cmfb}$. Any input offsets of amplifiers 612 and 613 causes an offset current that flows into the integrator formed by tranconductance amplifier 614 and capacitors 653 and 654. The output of this integrator then drives the tranconductance amplifier 615 to generate a nulling current, which effectively nulls the offset current.

At the end of the auto-zeroing phase, switches 631-636 open. As a result, the voltage at the output of the integrator around amplifier 614 is held so that amplifier 615 continues nulling the offset current at the outputs of amplifiers 612 and 613. Subsequently, in the amplification phase, switches 641-646 are closed. $V_{in}$ and $V_{fb}$ are applied to amplifiers 612 and 613, respectively, and the summed output current of amplifiers 612, 613, and 615 is coupled with the intermediate stage (i.e., amplifier 616).

For low frequencies (e.g., below the clock frequency), the auto-zero path comprising amplifiers 611-616 is dominant, and the amplifier 600 then operates similar to a traditional current feedback instrumentation amplifier, except that the nulling current injected by amplifier 615 ensures that the input-referred offset voltages of amplifiers 612-613 do not contribute to the output voltage. Thereafter, in a subsequent auto-zeroing phase, the nested-Miller-compensated output stage formed by amplifier 611 and capacitors 651-652 and amplifier 616 and capacitors 656-657 hold the output voltage while amplifiers 612-613 are auto-zeroed again.

At high frequencies, the feedforward path comprising amplifiers 617-618 is dominant. The feedforward path, together with the output amplifier 611, forms a regular Miller-compensated two-stage amplifier with approximately 20 dB/dec roll-off. This type of frequency compensation is known as "multi-path nested-Miller compensation" and has been used in conventional op-amps, but without application to auto-zeroed instrumentation amplifiers.

In one embodiment, the frequency at which the feedforward path starts to dominate is:

$$\omega_{pz} = g_{618}/C_{651}, \quad (1)$$

(assuming $C_{651}=C_{652}$ and $g_{617}=g_{618}$). In a preferred embodiment, this frequency is chosen to be below the clock frequency. Above $\omega_{pz}$, the feedforward path ensures that the feedback signal $V_{fb}$ can track the input signal $V_{in}$. As a result, even if mixing occurs due to the gating at the inputs of amplifiers 612-613, the resulting mixing products cancel.

Figure 7:
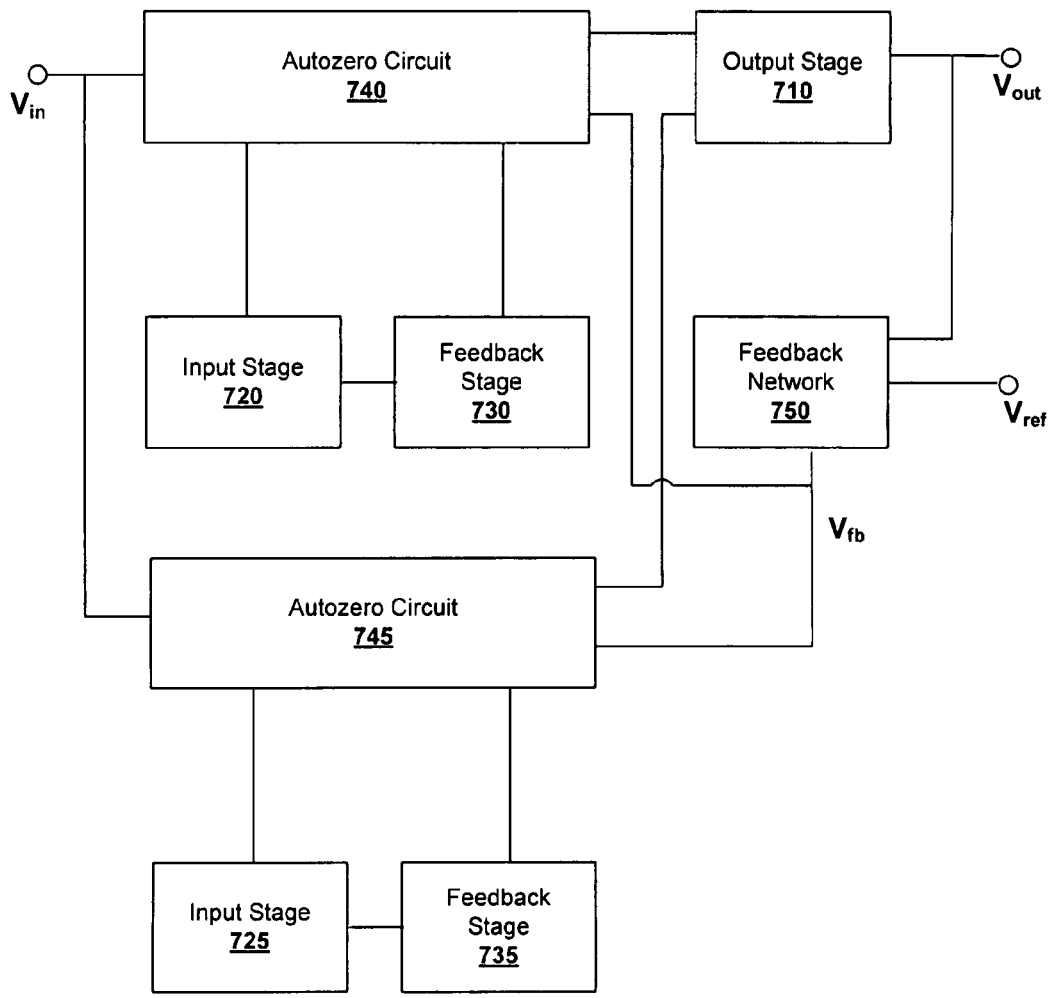
FIG. 7 illustrates a schematic of a current feedback instrumentation amplifier, including parallel input stages, in accordance with various embodiments of the present invention.

The above-referenced mixing problems may alternatively be solved by using a dual-input-stage "ping-pong" architecture. FIG. 7 illustrates a schematic of a current feedback instrumentation amplifier 700, including parallel input stages, in accordance with various embodiments of the present invention. Amplifier 700 includes first and second input stages 720 and 725, an output stage 710, first and second feedback stages 730 and 735, and a feedback network 750. The amplifier 700 also advantageously includes a first auto-zero circuit 740 coupled to the input stage 720, the output stage 710, and the feedback stage 730. The amplifier 700 further includes a second auto-zero circuit 745 coupled to the input stage 725, the output stage 710, and the feedback stage 735.

In one embodiment, the auto-zero circuits 740 and 745 serve to switch the amplifier 700 between first and second configurations corresponding to first and second phases of operation. For example, the first configuration may correspond to an auto-zero configuration of the auto-zero circuit 740 and an amplification configuration of the auto-zero circuit 745. Conversely, a second configuration may correspond to an auto-zero configuration of the auto-zero circuit 745 and an amplification configuration of the auto-zero circuit 740.

During the first phase, the first input stage 720 and the first feedback stage 730 are auto-zeroed while the second input stage 725 and the second feedback stage 735 perform the amplification functions of amplifier 700. Conversely, during the second phase, the second input stage 725 and the second feedback stage 735 are auto-zeroed while the first input stage 720 and the first feedback stage 730 perform the amplification functions of amplifier 700.

Thus, during the first phase, the auto-zero circuit 740 is operable to null offset currents generated by the first input stage 720 and the first feedback stage 730. In one embodiment, the auto-zero circuit 740 nulls the offset currents by shorting inputs of the first input stage 720 and the first feedback stage 730 to respective common mode voltages. Subsequently, the auto-zero circuit 740 may then measure corresponding offset currents generated by the first input stage 720 and the first feedback stage 730 and generate a nulling current based thereon. The nulling current serves to compensate for the offset currents generated by the first input stage 720 and the first feedback stage 730.

Concurrently, $V_{in}$ is applied to the second input stage 725, $V_{fb}$ is applied to the second feedback stage 735, and the second input stage 725 and second feedback stage 735 are coupled with the output stage 710 via the second auto-zero circuit 745. The amplifier 700 then operates similar to a traditional current feedback instrumentation amplifier, except that a nulling current injected by the second auto-zero circuit 745 (which is calibrated in the second phase, discussed below) ensures that the input-referred offset voltages of the second input stage 725 and the second feedback stage 735 do not contribute to the output voltage.

At the end of the first phase, the first auto-zero circuit 740 changes from an auto-zero configuration to an amplification configuration, and the second auto-zero circuit 745 changes from an amplification configuration to an auto-zero configuration. Thereafter, the auto-zero circuit 740 continues nulling the offset current at the outputs of the first input stage 720 and the first feedback stage 730.

Subsequently, in the second phase, $V_{in}$ is applied to the first input stage 720, $V_{fb}$ is applied to the first feedback stage 730, and the first input stage 720 and the first feedback stage 730 are coupled with the output stage 710 via the first auto-zero circuit 740. The amplifier 700 then operates similar to a traditional current feedback instrumentation amplifier, except that the nulling current injected by the first auto-zero circuit 740 ensures that the input-referred offset voltages of the first input stage 720 and the first feedback stage 730 do not contribute to the output voltage.

During the second phase, while the first input stage 720 and the first feedback stage 730 are performing amplification functions, the second auto-zero circuit 745 is operable to null offset currents generated by the second input stage 725 and the second feedback stage 735. In one embodiment, the second auto-zero circuit 745 nulls the offset currents by shorting inputs of the second input stage 725 and the second feedback stage 735 to respective common mode voltages. Subsequently, the second auto-zero circuit 745 may then measure corresponding offset currents generated by the second input stage 725 and the second feedback stage 735 and generate a nulling current based thereon. The nulling current serves to compensate for the offset currents generated by the second input stage 725 and the second feedback stage 735.

During operation, the auto-zeroing circuits 740 and 745 of amplifier 700 periodically switch amplifier 700 between the first configuration and the second configuration, ensuring that the input stages 720 and 725 and feedback stages 730 and 735 are periodically recalibrated. Thus, this "ping-pong" operation ensures that there is continuously an offset-free stage in the signal path.

Figure 8:
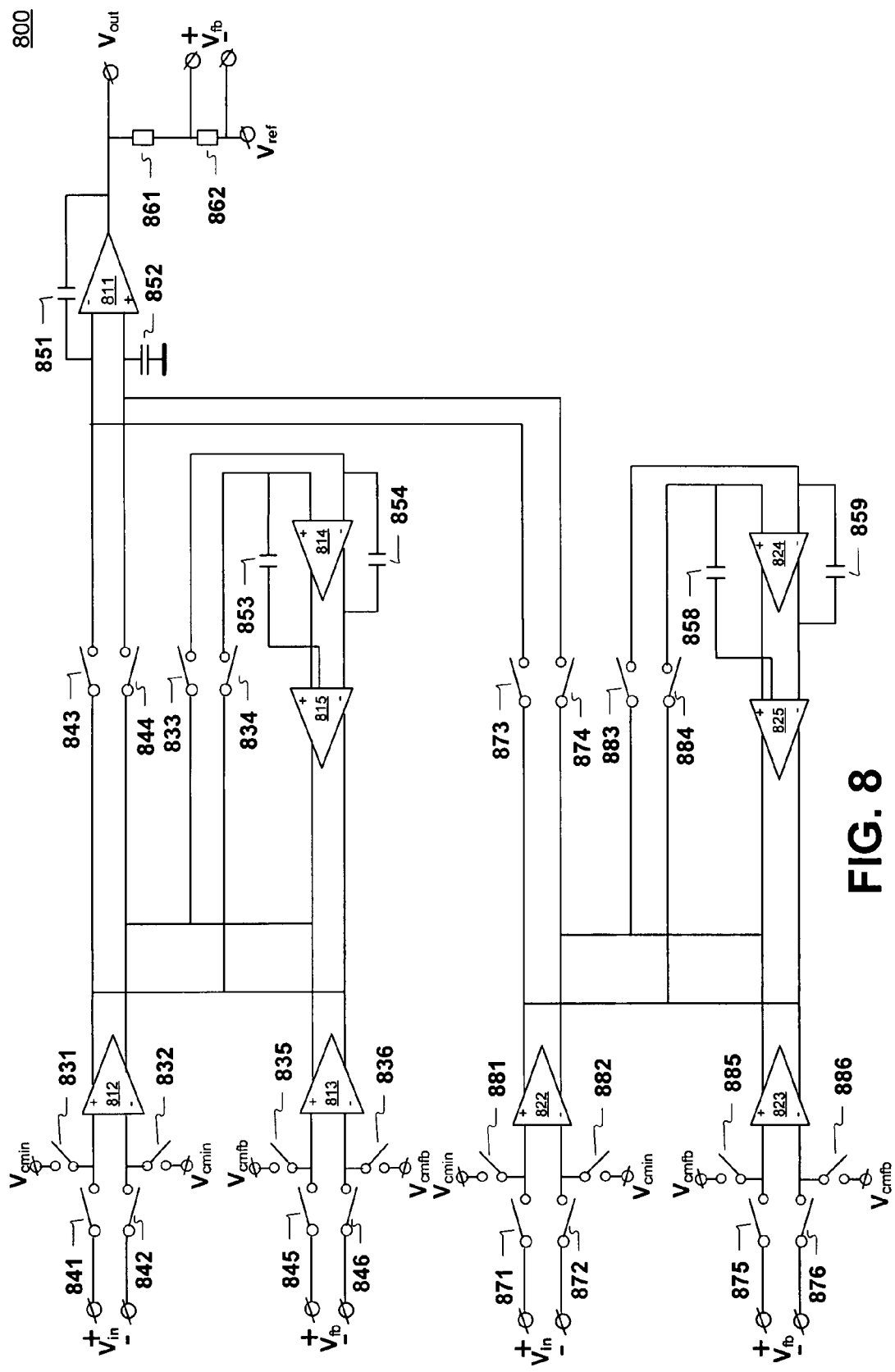
FIG. 8 illustrates a schematic of a current feedback instrumentation amplifier, including parallel input stages, in accordance with various embodiments of the present invention.

It is appreciated that amplifier 700 may be achieved in a number of ways. For example, FIG. 8 illustrates a schematic of a current feedback instrumentation amplifier 800, including parallel input stages, in accordance with various embodiments of the present invention. In amplifier 800, tranconductance amplifier 811 serves as an output stage, such as output stage 710 in amplifier 700, tranconductance amplifiers 812 and 822 serve as first and second input stages, such as input stages 720 and 725 of amplifier 700, tranconductance amplifiers 813 and 823 serve as first and second feedback stages, such as feedback stages 730 and 735 of amplifier 700, and resistors 861 and 862 together serve as a feedback network, such as feedback network 750 of amplifier 700. Although embodiments may be described herein with reference to single tranconductance amplifiers, it should be appreciated that embodiments are not limited as such. For example, a cascade of multiple stages with appropriate frequency compensation may be used in place of the single tranconductance amplifier 811 in order to obtain a higher gain. Capacitors 851 and 852 serve as frequency compensators for the tranconductance amplifier 811, thus forming a Miller-compensated output stage. Resistors 861 and 862, together with the reference voltage $V_{ref}$, generate the feedback voltage $V_{fb}$ based on the output voltage $V_{out}$. $V_{fb}$ is fed back as an input to the feedback tranconductance amplifiers 813 and 823.

Switches 831-836 and 841-846, tranconductance amplifiers 814 and 815, and capacitors 853 and 854 function together as a first auto-zero circuit, such as auto-zero circuit 740 of amplifier 700. Similarly, switches 871-876 and 881-886, tranconductance amplifiers 824 and 825, and capacitors 858 and 859 function together as a second auto-zero circuit, such as auto-zero circuit 745 of amplifier 700. It should be appreciated that switches 831-836, 841-846, 871-876, and 881-886 may be any of a number of devices capable of performing a switching function. In one embodiment, the switches 831-836, 841-846, 871-876, and 881-886 serve to switch the amplifier 800 between first and second configurations corresponding to first and second phases of operation. For example, the first configuration may correspond to switches 831-836 and 871-876 being closed and switches 841-846 and 881-886 being open. Conversely, a second configuration may correspond to switches 841-846 and 881-886 being closed and switches 831-836 and 871-876 being open.

During the first phase, the first input stage and the first feedback stage are auto-zeroed while the second input stage and the second feedback stage perform the amplification functions of amplifier 800. Conversely, during the second phase, the second input stage and the second feedback stage are auto-zeroed while the first input stage and the first feedback stage perform the amplification functions of amplifier 800.

Thus, during the first phase, the inputs of the tranconductance amplifiers 812 and 813 are shorted to the input common mode voltage $V_{cmin}$ and the feedback common mode voltage $V_{cmfb}$, respectively. Any input offsets of amplifiers 812 and 813 cause an offset current that flows into the integrator formed by tranconductance amplifier 814 and capacitors 853 and 854. The output of this integrator then drives the tranconductance amplifier 815 to generate a nulling current, which effectively nulls the offset current.

Concurrently, $V_{in}$ and $V_{fb}$ are applied to amplifiers 822 and 823, respectively, and the summed output current of amplifiers 822, 823, and 825 is coupled with the output stage (i.e., amplifier 811, etc.). The amplifier 800 then operates similar to a traditional current feedback instrumentation amplifier, except that a nulling current injected by amplifier 825 (which is calibrated in the second phase, discussed below) ensures that the input-referred offset voltages of amplifiers 822-823 do not contribute to the output voltage.

At the end of the first phase, switches 831-836 and 871-876 open. As a result, the voltage at the output of the integrator around amplifier 814 is held so that amplifier 815 continues nulling the offset current at the outputs of amplifiers 812 and 813.

Subsequently, in the second phase, switches 841-846 and 881-886 are closed. $V_{in}$ and $V_{fb}$ are applied to amplifiers 812 and 813, respectively, and the summed current of amplifiers 812, 813, and 815 is coupled with the output stage (i.e., amplifier 811, etc.). The amplifier 800 then operates similar to a traditional current feedback instrumentation amplifier, except that the nulling current injected by amplifier 815 insures that the input-referred offset voltages of amplifiers 812-813 do not contribute to the output voltage.

During the second phase, while the first input stage and the first feedback stage are performing amplification functions, the second input stage and the second feedback stage are auto-zeroed. In other words, the inputs of the tranconductance amplifiers 822 and 823 are shorted to the input common mode voltage $V_{cmin}$ and the feedback common mode voltage $V_{cmfb}$, respectively. Any input offsets of amplifiers 822 and 823 cause an offset current that flows into the integrator formed by tranconductance amplifier 824 and capacitors 858 and 859. The output of this integrator then drives the tranconductance amplifier 825 to generate a nulling current, which effectively nulls the offset current.

During operation, the auto-zeroing circuits of amplifier 800 periodically switch amplifier 800 between the first configuration and the second configuration, ensuring that the input stages and feedback stages are periodically recalibrated. Thus, this "ping-pong" operation ensures that there is continuously an offset-free stage in the signal path.

Figure 9:
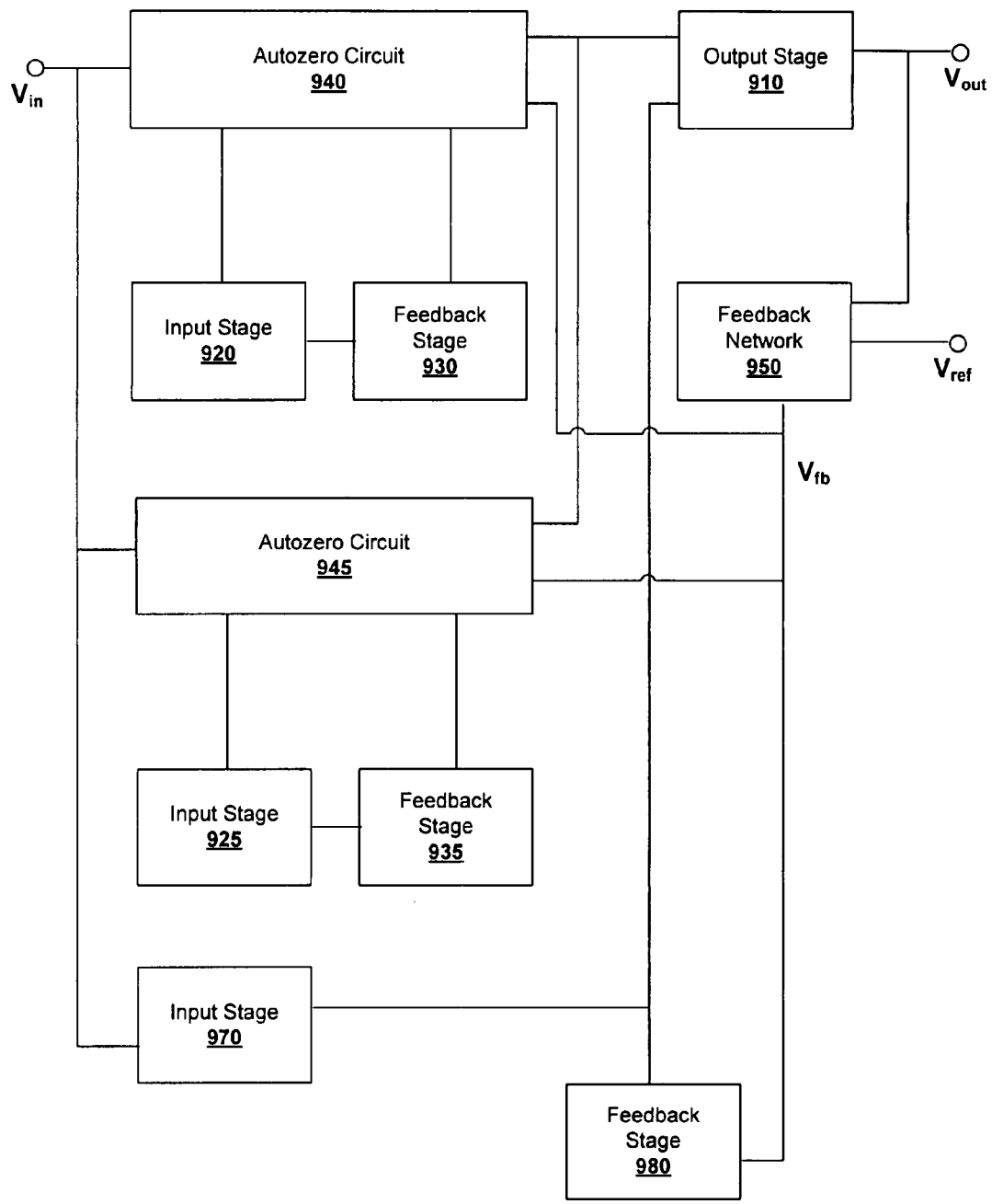
FIG. 9 illustrates a block diagram of a current feedback instrumentation amplifier, including parallel input stages and a high-frequency feedforward path, in accordance with various embodiments of the present invention.

It is appreciated that switching between parallel input and feedback stages may cause corresponding transients to appear in the output signal. Therefore, in one embodiment, a high-frequency feedforward path may be used in combination with the ping-pong architecture of FIG. 8. FIG. 9 illustrates a block diagram of a current feedback instrumentation amplifier 900, including parallel input stages and a high-frequency feedforward path, in accordance with various embodiments of the present invention. Amplifier 900 includes first, second, and third input stages 920 925, and 970, an output stage 910, first, second, and third feedback stages 930, 935, and 980, and a feedback network 950. The amplifier 900 also advantageously includes a first auto-zero circuit 940 coupled to the input stage 920, the output stage 910, and the feedback stage 930. The amplifier 900 further includes a second auto-zero circuit 945 coupled to the input stage 925, the output stage 910, and the feedback stage 935.

In one embodiment, the auto-zero circuits 940 and 945 serve to switch the amplifier 900 between first and second configurations corresponding to first and second phases of operation. For example, the first configuration may correspond to an auto-zero configuration of the auto-zero circuit 940 and an amplification configuration of the auto-zero circuit 945. Conversely, a second configuration may correspond to an auto-zero configuration of the auto-zero circuit 945 and an amplification configuration of the auto-zero circuit 940.

During the first phase, the first input stage 920 and the first feedback stage 930 are auto-zeroed while the second input stage 925 and the second feedback stage 935 perform the amplification functions of amplifier 900. Conversely, during the second phase, the second input stage 925 and the second feedback stage 935 are auto-zeroed while the first input stage 920 and the first feedback stage 930 perform the amplification functions of amplifier 900.

Thus, during the first phase, the auto-zero circuit 940 is operable to null offset currents generated by the first input stage 920 and the first feedback stage 930. In one embodiment, the auto-zero circuit 940 nulls the offset currents by shorting inputs of the first input stage 920 and the first feedback stage 930 to respective common mode voltages. Subsequently, the auto-zero circuit 940 may then measure corresponding offset currents generated by the first input stage 920 and the first feedback stage 930 and generate a nulling current based thereon. The nulling current serves to compensate for the offset currents generated by the first input stage 920 and the first feedback stage 930.

Concurrently, $V_{in}$ is applied to the second input stage 925, and $V_{fb}$ is applied to the second feedback stage 935, and the second input stage 925 and second feedback stage 935 are coupled with the output stage 910 via the second auto-zero circuit 945. The amplifier 900 then operates similar to a traditional current feedback instrumentation amplifier, except that a nulling current injected by the second auto-zero circuit 945 (which is calibrated in the second phase, discussed below) ensures that the input-referred offset voltages of the second input stage 925 and the second feedback stage 935 do not contribute to the output voltage.

At the end of the first phase, the first auto-zero circuit 940 changes from an auto-zero configuration to an amplification configuration, and the second auto-zero circuit 945 changes from an amplification configuration to an auto-zero configuration. Thereafter, the auto-zero circuit 940 continues nulling the offset current at the outputs of the first input stage 920 and the first feedback stage 930.

Subsequently, in the second phase, $V_{in}$ is applied to the first input stage 920, $V_{fb}$ is applied to the first feedback stage 930, and the first input stage 920 and the first feedback stage 930 are coupled with the output stage 910 via the first auto-zero circuit 940. The amplifier 900 then operates similar to a traditional current feedback instrumentation amplifier, except that the nulling current injected by the first auto-zero circuit 940 ensures that the input-referred offset voltages of the first input stage 920 and the first feedback stage 930 do not contribute to the output voltage.

During the second phase, while the first input stage 920 and the first feedback stage 930 are performing amplification functions, the second auto-zero circuit 945 is operable to null offset currents generated by the second input stage 925 and the second feedback stage 935. In one embodiment, the second auto-zero circuit 945 nulls the offset currents by shorting inputs of the second input stage 925 and the second feedback stage 935 to respective common mode voltages. Subsequently, the second auto-zero circuit 945 may then measure corresponding offset currents generated by the second input stage 925 and the second feedback stage 935 and generate a nulling current based thereon. The nulling current serves to compensate for the offset currents generated by the second input stage 925 and the second feedback stage 935.

During operation, the auto-zeroing circuits 940 and 945 of amplifier 900 periodically switch amplifier 900 between the first configuration and the second configuration, ensuring that the input stages 920 and 925 and feedback stages 930 and 935 are periodically recalibrated. Thus, this "ping-pong" operation ensures that there is continuously an offset-free stage in the signal path.

For low frequencies (e.g., below the clock frequency), the ping-pong auto-zeroed paths comprising input stages 920 and 925, feedback stages 930 and 935, and auto-zero circuits 940 and 945 are dominant, and the amplifier 900 then operates similar to a traditional current feedback instrumentation amplifier, except that the nulling currents injected by the auto-zero circuits 940 and 945 ensure that the input-referred offsets of input stages 920 and 925 and feedback stages 930 and 935 do not contribute to the output voltage.

At high frequencies, the feedforward path comprising input stage 970 and feedback stage 980 is dominant. Above a threshold frequency, the feedforward path ensures that a feedback signal $V_{fb}$ can track the input signal $V_{in}$. As a result, even if mixing occurs due to the gating at the inputs of input stages 920 and 925 and feedback stages 930 and 935, the resulting mixing products cancel.

Figure 10:
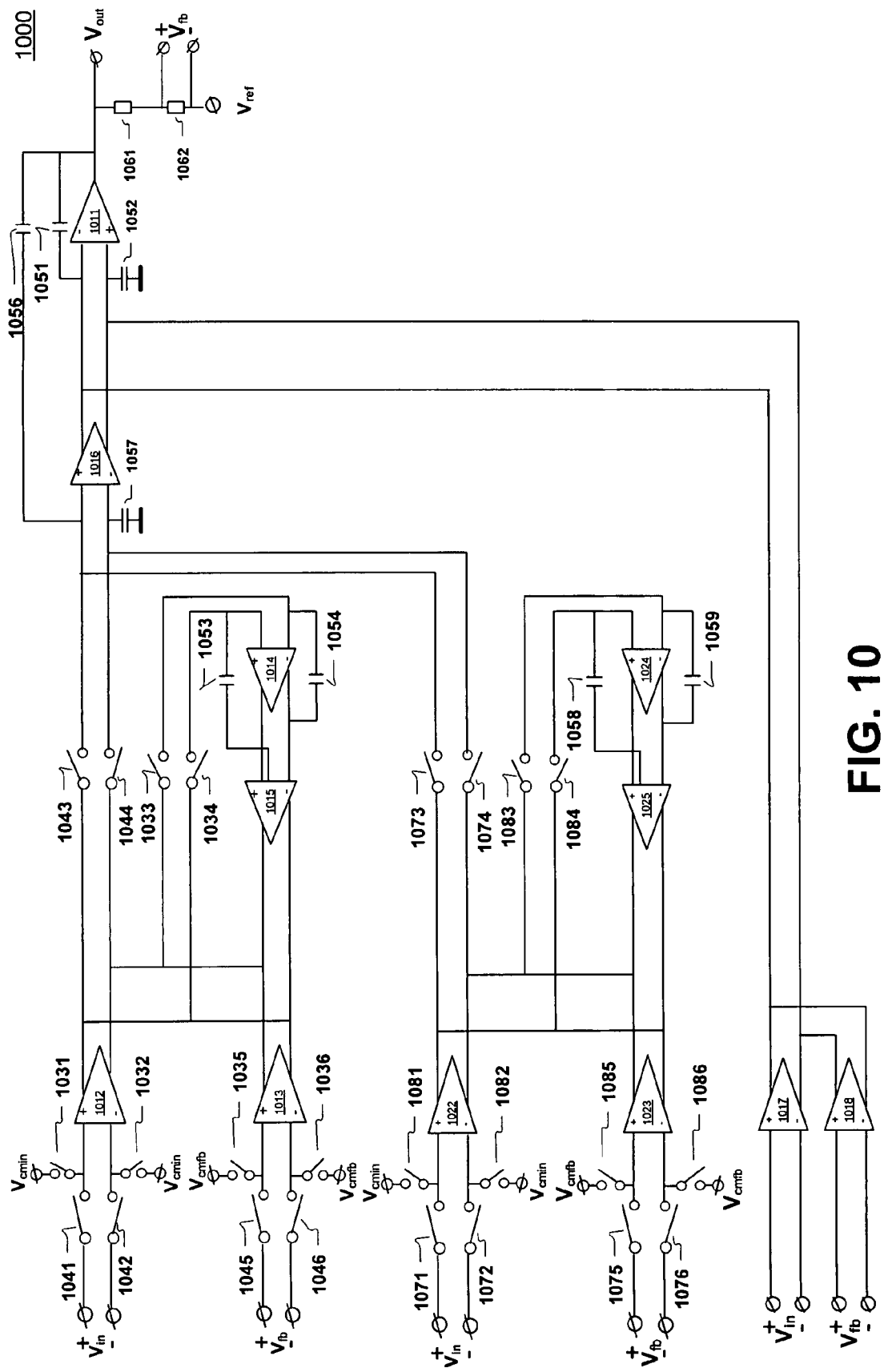
FIG. 10 illustrates a schematic of a current feedback instrumentation amplifier, including parallel input stages and a high-frequency feedforward path, in accordance with various embodiments of the present invention.

FIG. 10 illustrates a schematic of a current feedback instrumentation amplifier 1000, including parallel input stages and a high-frequency feedforward path, in accordance with various embodiments of the present invention. In amplifier 1000, tranconductance amplifiers 1011 and 1016 together serve as an output stage, such as output stage 910 in amplifier 900, tranconductance amplifiers 1012, 1022, and 1017 serve as first, second, and third input stages, such as input stages 920, 925, and 970 of amplifier 900, tranconductance amplifiers 1013, 1023, and 1018 serve as first, second, and third feedback stages, such as feedback stages 930, 935, and 980 of amplifier 900, and resistors 1061 and 1062 together serve as feedback network, such as feedback network 950 of amplifier 900. Additionally, tranconductance amplifier 1016, along with capacitors 1056-1057, serves as a Miller-compensated intermediate stage to amplifier 1000. Capacitors 1051 and 1052 serve as frequency compensators for the tranconductance amplifier 1011, thus forming a nested-Miller-compensated output stage. Resistors 1061 and 1062, together with the reference voltage $V_{ref}$, generate the feedback voltage $V_{fb}$ based on the output voltage $V_{out}$. $V_{fb}$ is fed back as an input to the feedback tranconductance amplifiers 1013, 1023, and 1018.

Switches 1031-1036 and 1041-1046, tranconductance amplifiers 1014 and 1015, and capacitors 1053 and 1054 function together as a first auto-zero circuit, such as auto-zero circuit 940 of amplifier 900. Similarly, switches 1071-1076 and 1081-1086, tranconductance amplifiers 1024 and 1025, and capacitors 1058 and 1059 function together as a second auto-zero circuit, such as auto-zero circuit 945. It should be appreciated that switches 1031-1036, 1041-1046, 1071-1076, and 1081-1086 may be any of a number of devices capable of performing a switching function. In one embodiment, the switches 1031-1036, 1041-1046, 1071-1076, and 1081-1086 serve to switch the amplifier 1000 between first and second configurations corresponding to first and second phases of operation. For example, the first configuration may correspond to switches 1031-1036 and 1071-1076 being closed and switches 1041-1046 and 1081-1086 being open. Conversely, a second configuration may correspond to switches 1041-1046 and 1081-1086 being closed and switches 1031-1036 and 1071-1076 being open.

During the first phase, the first input stage and the first feedback stage are auto-zeroed while the second input stage and the second feedback stage perform the amplification functions of amplifier 1000. Conversely, during the second phase, the second input stage and the second feedback stage are auto-zeroed while the first input stage and the first feedback stage perform the amplification functions of amplifier 1000.

Thus, during the first phase, the inputs of the tranconductance amplifiers 1012 and 1013 are shorted to the input common mode voltage $V_{cmin}$ and the feedback common mode voltage $V_{cmfb}$, respectively. Any input offsets of amplifiers 1012 and 1013 cause an offset current that flows into the integrator formed by tranconductance amplifier 1014 and capacitors 1053 and 1054. The output of this integrator then drives the tranconductance amplifier 1015 to generate a nulling current, which effectively nulls the offset current.

Concurrently, $V_{in}$ and $V_{fb}$ are applied to amplifiers 1022 and 1023, respectively, and the summed output current of amplifiers 1022, 1023, and 1025 is coupled with the intermediate stage (i.e., amplifier 1016). The amplifier 1000 then operates similar to a traditional current feedback instrumentation amplifier, except that a nulling current injected by amplifier 1025 (which is calibrated in the second phase, discussed below) ensures that the input-referred offset voltages of amplifiers 1022-1023 do not contribute to the output voltage.

At the end of the first phase, switches 1031-1036 and 1071-1076 open. As a result, the voltage at the output of the integrator around amplifier 1014 is held so that amplifier 1015 continues nulling the offset current at the outputs of amplifiers 1012 and 1013.

Subsequently, in the second phase, switches 1041-1046 and 1081-1086 are closed. $V_{in}$ and $V_{fb}$ are applied to amplifiers 1012 and 1013, respectively, and the summed current of amplifiers 1012, 1013, and 1015 is coupled with the intermediate stage (i.e., amplifier 1016). The amplifier 1000 then operates similar to a traditional current feedback instrumentation amplifier, except that the nulling current injected by amplifier 1015 insures that the input-referred offset voltages of amplifiers 1012-1013 do not contribute to the output voltage.

During the second phase, while the first input stage and the first feedback stage are performing amplification functions, the second input stage and the second feedback stage are auto-zeroed. In other words, the inputs of the tranconductance amplifiers 1022 and 1023 are shorted to the input common mode voltage $V_{cmin}$ and the feedback common mode voltage $V_{cmfb}$, respectively. Any input offsets of amplifiers 1022 and 1023 cause a corresponding offset current that flows into the integrator formed by tranconductance amplifier 1024 and capacitors 1058 and 1059. The output of this integrator then drives the tranconductance amplifier 1025 to generate a nulling current, which effectively nulls the offset current.

During operation, the auto-zeroing circuits of amplifier 1000 periodically switch amplifier 1000 between the first configuration and the second configuration, ensuring that the input stages and feedback stages are periodically recalibrated. Thus, this "ping-pong" operation ensures that there is continuously an offset-free stage in the signal path.

At high frequencies, the feedforward path comprising amplifiers 1017-1018 is dominant. Together with the output amplifier 1011, it forms a regular Miller-compensated two-stage amplifier with approximately 20 dB/dec roll-off. In one embodiment, the frequency at which the feedforward path starts to dominate is:

$$\omega_{pz} = g_{1018}/C_{1051}, \quad (2)$$

(assuming $C_{1051} = C_{1052}$ and $g_{1017} = g_{1018}$). In a preferred embodiment, this frequency is chosen to be below the clock frequency. Above $\omega_{pz}$, the feedforward path ensures that the feedback signal $V_{fb}$ can track the input signal $V_{in}$. As a result, switching transients associated with switching between first and second configurations are suppressed. The lower $\omega_{pz}$, the higher the relative gain of the feedforward path at the clock frequency and its harmonics, and therefore the better the attenuation of such switching transients.

In some cases, a residual offset may appear in amplifiers 400, 500, 600, 700, 800, 900, and 1000. This residual offset may be produced by a number of factors. For example, with reference to FIG. 4, due to the finite output impedance of amplifiers 412, 413, and 415, the offset of the output amplifier 411 may result in an offset current that is not compensated for by the auto-zeroing loop formed by amplifiers 414-415, and therefore causes an input-referred offset voltage. Second, the finite gain in the auto-zeroing loop may result in a residual input-referred offset voltage. Thirdly, due to charge injection at the end of the auto-zeroing phase, the voltage stored on integrator capacitors 453-454 may change slightly, resulting in a small error in the nulling current injected by amplifier 415 during the amplification phase. It should be appreciated that similar effects may occur in amplifiers 500, 600, 700, 800, 900, and 1000.

Figure 11:
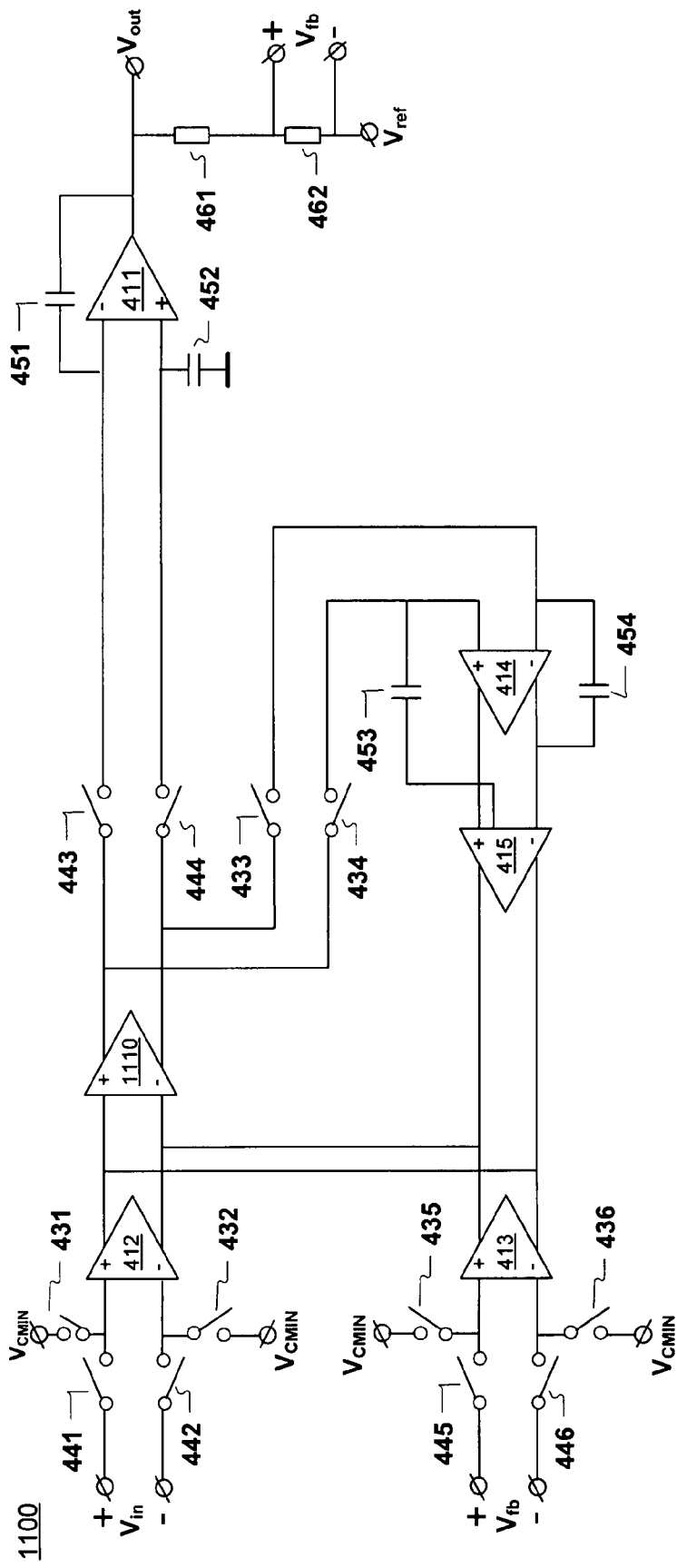
FIG. 11 illustrates a schematic of a current feedback instrumentation amplifier, including a current buffer stage, in accordance with various embodiments of the present invention.

In one embodiment, both residual offset due to the offset of the output stage and the residual offset due to finite gain in the auto-zeroing circuitry can be reduced by adding a current buffer stage 1110, as shown in FIG. 11. Although amplifier 1100 as illustrated in FIG. 11 does not include a feedforward path or ping-pong circuitry, it should be appreciated that the addition of a current buffer stage in a similar manner may be achieved for amplifiers 500, 600, 700, 800, 900, and 1000.

The current buffer stage 1110 increases the impedance at the input of amplifier 411. Therefore, the gain in the auto-zero loop is increased and the voltage offset of amplifier 411 results in a smaller offset current. In the embodiment depicted in FIG. 11, offset introduced by the current buffer stage 1110 itself is removed by the auto-zeroing process. The current buffer may be implemented as a simple cascode stage. Gain boosting may be applied to further reduce the residual offset. In another embodiment, an actual gain stage may be applied instead of, or in combination with, the current buffer stage 1110. It should be appreciated that in such a case, an extra dominant pole will be introduced that will require additional frequency compensation.

In one embodiment, the residual offset due to charge injection may be kept small by using fully-differential circuitry. Charge injection would then be reduced to charge-injection mismatch. In one embodiment, the offset may be further reduced by using small switches and large integrator capacitors. In yet another embodiment, the transconductance (i.e., $g_{415}$, $g_{815}$, etc.) of the nulling amplifiers 415, 615, 815, 825, 1015, and 1025 may be made smaller than the transconductance of their respective input and feedback amplifiers, so that the voltages at the outputs of the integrators will be larger than the offset voltages at the inputs of the respective input and feedback amplifiers. The smaller the transconductance of the nulling amplifiers, the smaller the input-referred offsets due to given errors in the voltages at the outputs of the integrators.

Figure 12:
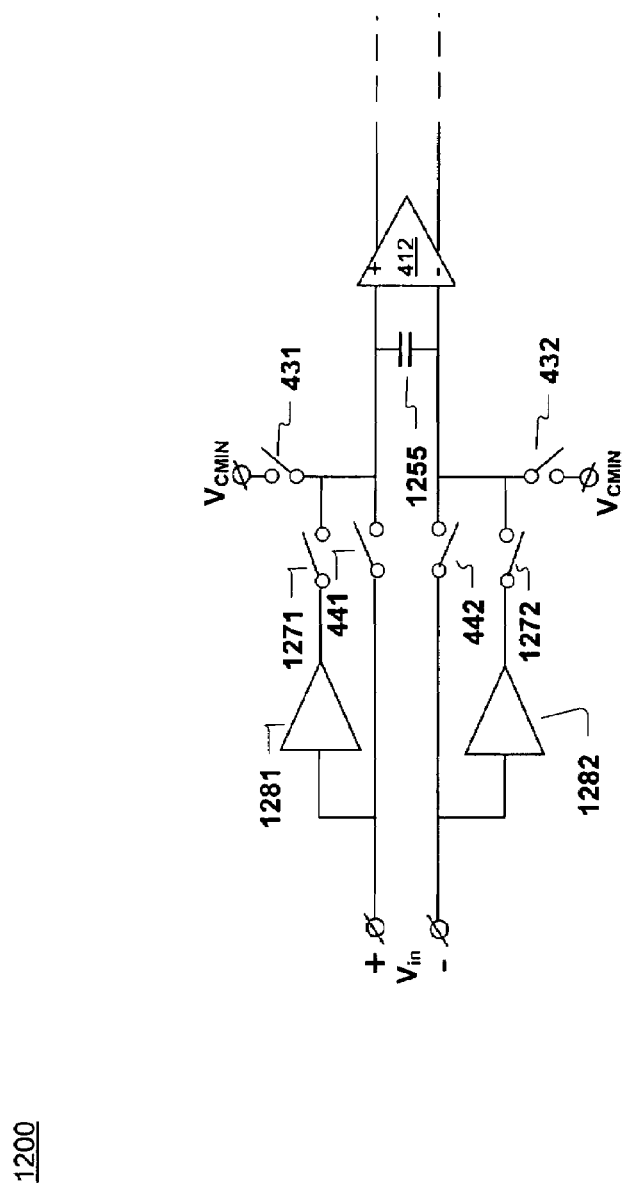
FIG. 12 illustrates an input stage of an instrumentation amplifier that includes pre-charging circuitry, in accordance with various embodiments of the present invention.

It should be appreciated that the tranconductance amplifiers 412, 612, 812, 822, 1012, and 1022 of FIGS. 4, 6, 8, and 10 have associated amounts of input capacitance. As such, the amplifiers 412, 612, 812, 822, 1012, and 1022 may act as switched-capacitor loads to the signal source $V_{in}$ because they are periodically discharged during auto-zeroing phases and need to be recharged during amplification phases. In various embodiments, this effect may be reduced by using a pre-charging technique. FIG. 12 illustrates an input stage 1200 of an amplifier (such as amplifier 400) that includes pre-charging circuitry, in accordance with various embodiments of the present invention. It should be appreciated that similar configurations may be used in amplifiers 300, 500, 600, 700, 800, 900, and 1000 as well. In FIG. 6, the input capacitance of amplifier 412 is depicted by capacitor 1255. Input stage 1200 includes additional switches 1271 and 1272, which allow for a "pre-charging" configuration of the input stage 1200, in addition to the amplification configuration and the auto-zeroing configuration. During the pre-charging phase, switches 431-432 and 441-442 are opened and switches 1271-1272 are closed. As a result, the inputs of amplifier 412 are coupled with a buffered version of the input signal $V_{in}$ via buffers 1281 and 1282, so that the current needed to charge the input capacitance 1255 is provided by the buffer amplifiers 1281-1282, rather than by the signal source. In one embodiment, the buffers are 1281-1282 are unity gain buffers. Thus, in a subsequent amplification phase, the signal source only needs to provide current to correct for any small offset errors of the buffer amplifiers 1281-1282, rather than the full input voltage $V_{in}$. It should be appreciated that while an input stage 1200 is depicted in FIG. 12, the input capacitances of other tranconductance amplifiers may be pre-charged in a similar fashion.

For example, feedback amplifiers 413, 613, 813, 823, 1013, and 1023 may be pre-charged to $V_{fb}$ to reduce loading from their respective feedback networks.

Exemplary Operations in Accordance with Various Embodiments

The following discussion sets forth in detail the operation of present technology for reducing effects of offsets in current feedback instrumentation amplifiers. With reference to FIGS. 13-17, flowcharts 1300, 1350A, 1410A, 1600, and 1625A each illustrate example operations used by various embodiments of the present technology for reducing effects of offsets in current feedback instrumentation amplifiers. Flowcharts 1300, 1350A, 1410A, 1600, and 1625A include processes that, in various embodiments, are carried out by circuitry in an integrated circuit. Although specific operations are disclosed in flowcharts 1300, 1350A, 1410A, 1600, and 1625A, such operations are examples. That is, embodiments are well suited to performing various other operations or variations of the operations recited in flowcharts 1300, 1350A, 1410A, 1600, and 1625A. It is appreciated that the operations in flowcharts 1300, 1350A, 1410A, 1600, and 1625A may be performed in an order different than presented, and that not all of the operations in flowcharts 1300, 1350A, 1410A, 1600, and 1625A may be performed.

Figure 13:
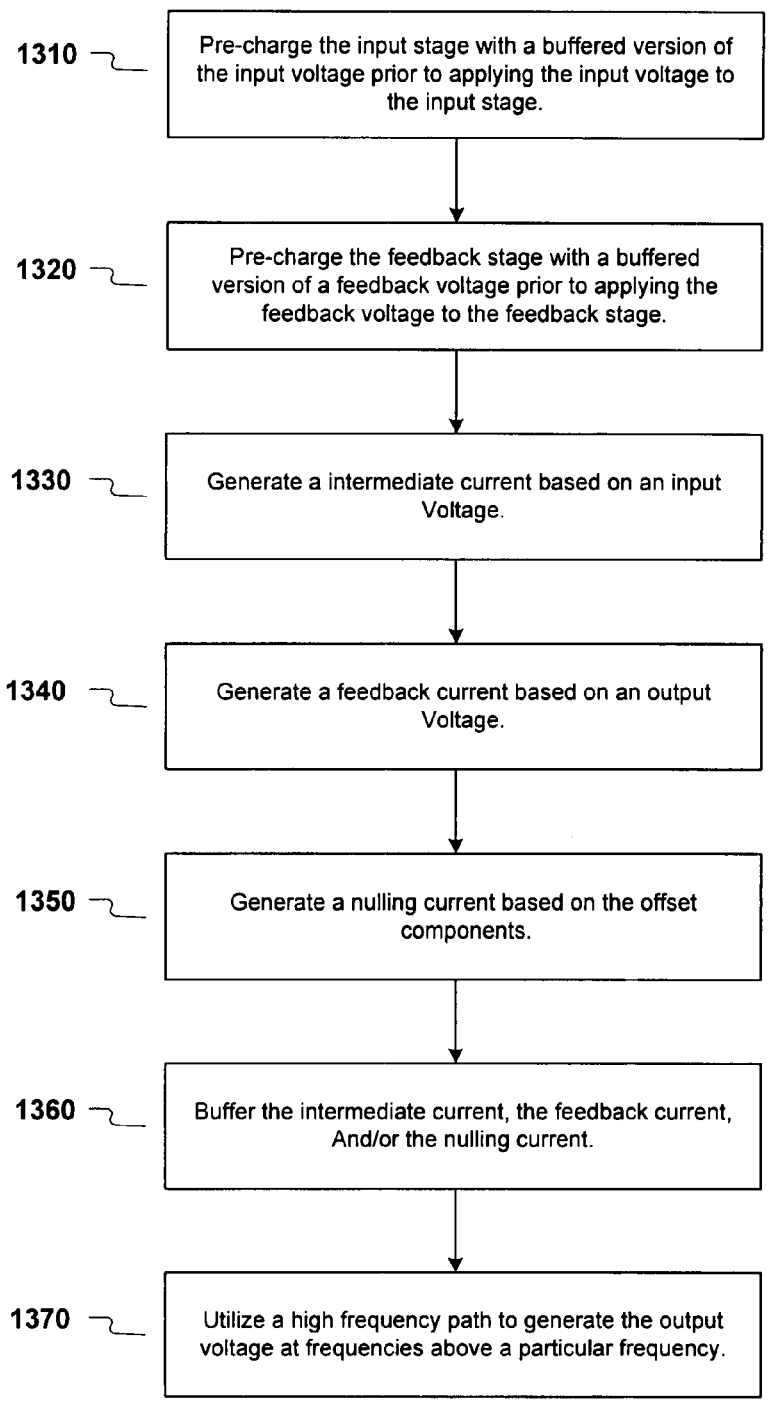
FIG. 13 illustrates a flowchart of a process for reducing effects of offsets in a current feedback instrumentation amplifier, in accordance with various embodiments of the present invention.

FIG. 13 illustrates a flowchart 1300 of a process for reducing effects of offsets in a current feedback instrumentation amplifier, in accordance with various embodiments of the present invention. At block 1310, an input stage of the instrumentation amplifier may optionally be pre-charged with a buffered version of the input voltage prior to actually applying the input voltage to the input stage. At block 1320, a feedback stage is similarly pre-charged with a buffered version of a feedback voltage. It is appreciated that the precharge voltages may vary somewhat from the input and feedback voltages themselves. However, pre-charging in this manner reduces loading of the input and feedback voltages by any input capacitances in the input stage and feedback stage respectively.

Figure 14:
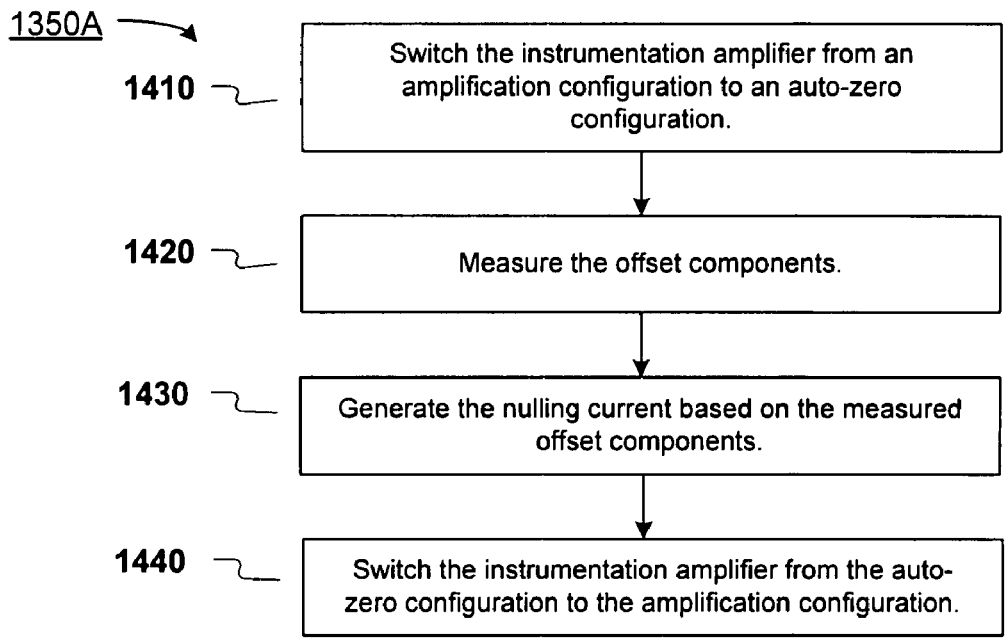
FIG. 14 illustrates a flowchart of a process for generating a nulling current, in accordance with various embodiments of the present invention.
Figure 15:
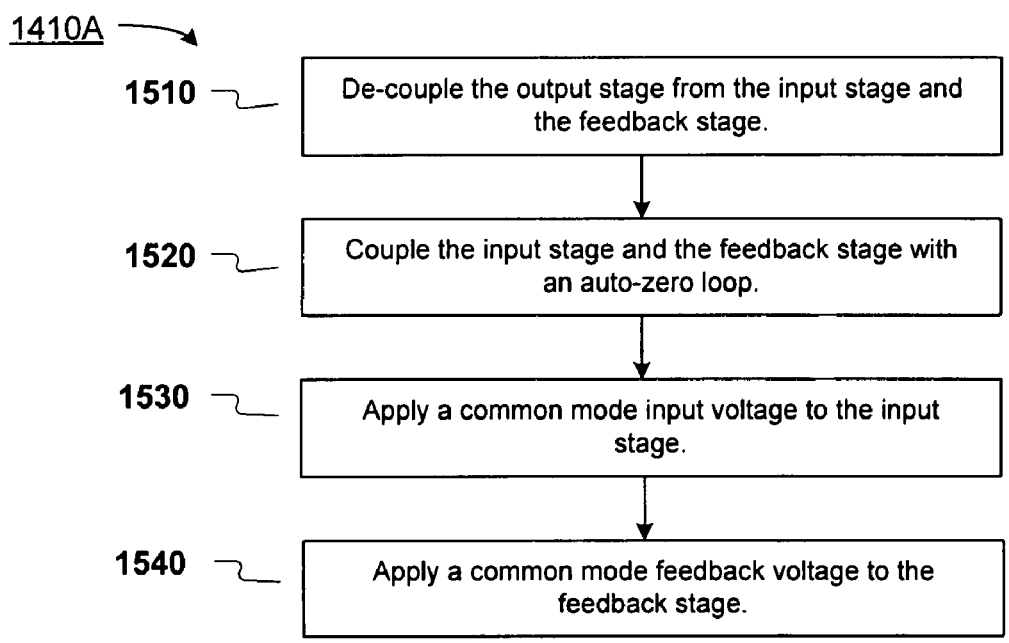
FIG. 15 illustrates a flowchart of a process for switching an instrumentation amplifier from an amplification configuration to an auto-zero configuration, in accordance with various embodiments of the present invention.

Block 1330 involves generating an intermediate current based on the input voltage. Block 1340 involves generating a feedback current based on an output voltage of the instrumentation amplifier. It is appreciated that in a conventional instrumentation amplifier, the intermediate current and feedback current would have error components due to input offsets of the input stage and the feedback stage. Thus, at block 1350, a nulling current is generated based on the offset components. It should be appreciated that generating the nulling current may be achieved in a number of ways. For example, FIG. 14 illustrates a flowchart 1350A of a process for generating a nulling current, in accordance with various embodiments of the present invention. At block 1410, the instrumentation amplifier is switched from an amplification configuration to an auto-zero configuration. It should be appreciated that this may also be achieved a number of ways. For example, FIG. 15 illustrates a flowchart 1410A of a process for switching and instrumentation amplifier from an amplification configuration to an auto-zero configuration, in accordance with various embodiments of the present invention. At block 1510, the output stage of the instrumentation amplifier is decoupled from the input stage in the feedback stage. During this period while the output stage is separated from the other stages of the amplifier, additional circuitry may be employed in order to effectively hold the output of the instrumentation amplifier. At block 1520, the input stage and the feedback stage are coupled with an auto-zero loop. This auto-zero loop may be substantially as described and shown above, but is not limited as such. Block 1530 then involves a common mode input voltage to the input stage. Similarly, block 1540 involves applying a common mode feedback voltage to the feedback stage.

With reference again to FIG. 14, block 1420 involves measuring the offset components. In one embodiment, this is achieved using an integrator, but is not limited as such. The nulling current is then generated based on the measured offset components (block 1430). At block 1440, the instrumentation amplifier is switched from the auto-zero configuration back to the amplification configuration. Thus, the instrumentation amplifier continues to compensate for the offsets during the amplification configuration by continuing to inject the nulling current.

With reference again to FIG. 13, block 1360 involves optionally buffering the intermediate current, the feedback current, the nulling current, or any combination thereof. In one embodiment, this may be achieved through the use of a cascode stage. At block 1370, a high-frequency path, which may be operated concurrently with the auto-zeroed low-frequency path, is utilized to generate the output voltages at frequencies above a particular frequency (e.g., the clock frequency). In other words, at high frequencies, the high-frequency path dominates the low-frequency auto-zeroed path, and the low-frequency auto-zeroed path dominates the high-frequency path at frequencies below the threshold frequency.

Figure 16A:
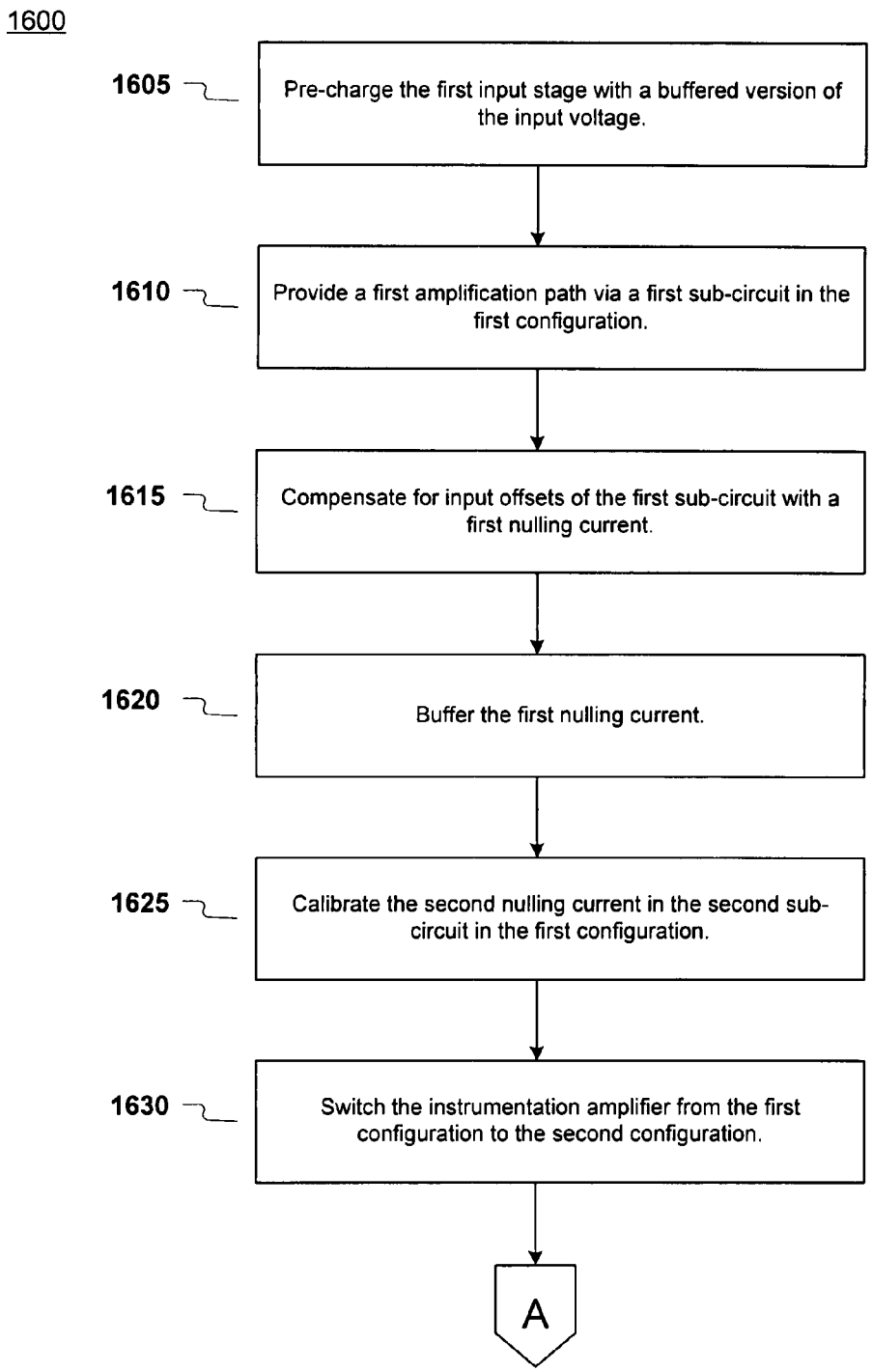
FIGS. 16A-16B illustrate a flowchart for a process for reducing the effects of offsets in an instrumentation amplifier, in accordance with various embodiments of the present invention.
Figure 16B:
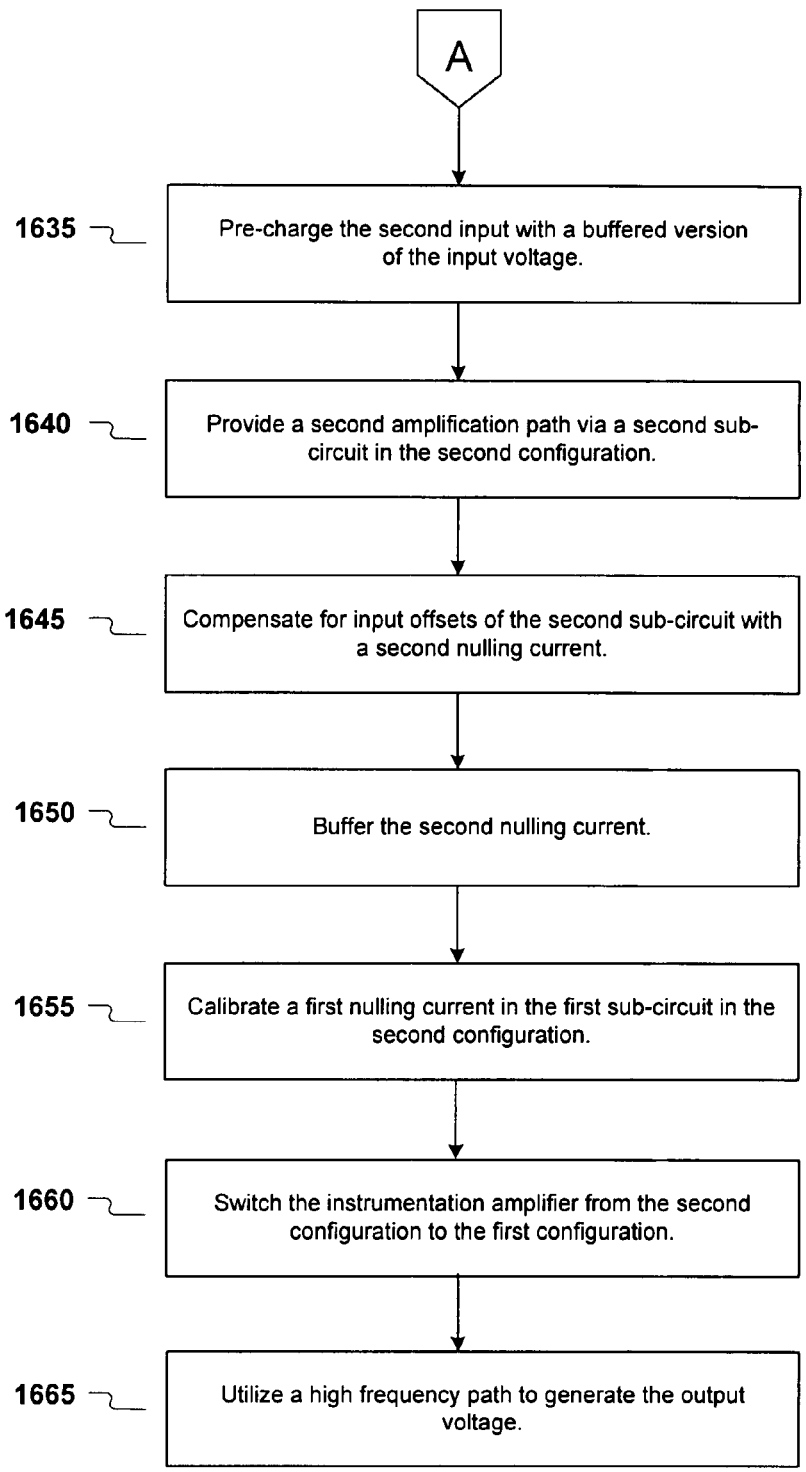
Figure 17:
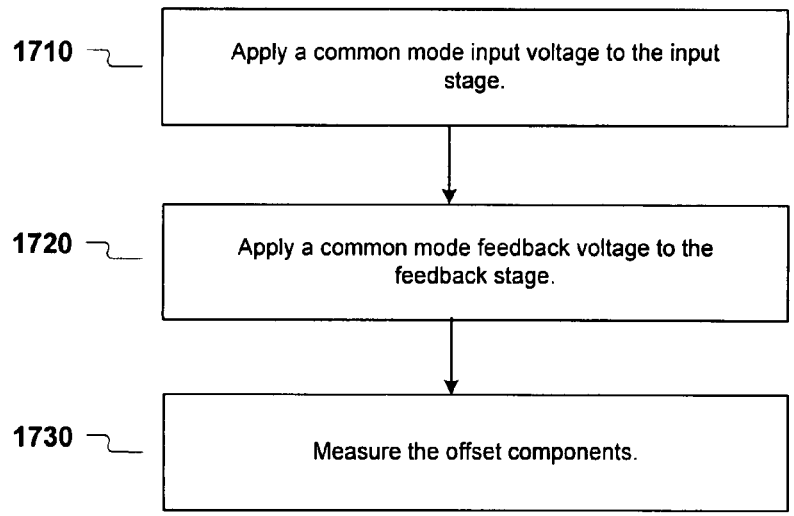
FIG. 17 illustrates a flowchart for a process of calibrating a nulling current, in accordance with various embodiments of the present invention.

Referring now to FIGS. 16A-16B, flowchart 1600 illustrates another process for reducing the effects of offsets in instrumentation amplifier, in accordance with various embodiments of the present invention. At block 1605, a first input stage of the instrumentation amplifier is optionally pre-charged with a buffered version of the input voltage. Although not illustrated in flowchart 1600, a first feedback stage of the amplifier may similarly be pre-charged with a feedback voltage. Again, it is appreciated that the pre-charge voltages may vary somewhat from the input and feedback voltages themselves. However, pre-charging in this manner reduces loading of the input and feedback voltages by any input capacitances in the first input stage and first feedback stage respectively. At block 1610, a first amplification path is provided via a first sub-circuit in a first configuration of the instrumentation amplifier. Block 1615 then involves compensating for input offsets of the first sub-circuit with a first nulling current. At block 1620 the first nulling current may optionally be buffered. This may be achieved, for example, with a cascode stage. It is appreciated that other currents may be buffered in a similar manner. At block 1625, a second nulling current of a second sub-circuit of the instrumentation amplifier is calibrated. It should be appreciated that the calibration may be achieved in a number of ways. For example, FIG. 17 illustrates a flowchart 1625A for a process of calibrating a nulling current, in accordance with various embodiments of the present invention. Block 1710 involves applying a common mode input voltage to the input stage (i.e., the input stage of the second sub-circuit). Block 1720 involves applying a common mode feedback voltage to a feedback stage (i.e., the feedback stage of the second sub-circuit). The common mode input voltage and the common mode feedback voltage will cause the input stage and the feedback stage to generate currents that correspond to any offsets of the input stage and the feedback stage. Thus, block 1730 involves measuring the offset components of the second sub-circuit.

With reference again to FIGS. 16A-16B, block 1630 involves switching the instrumentation amplifier from the first configuration to a second configuration. In one embodiment, the switching involves switching a first sub-circuit of the instrumentation amplifier from an amplification configuration to an auto-zero configuration and switching a second sub-circuit of the instrumentation amplifier from an auto-zero configuration to amplification configuration. At block 1635, an input stage of the second sub-circuit is optionally pre-charged with a buffered version of the input voltage. Similarly, a feedback stage of the second sub-circuit may be pre-charged with a buffered version of a feedback voltage.

At block 1640, a second amplification path is provided via the second sub-circuit while the instrumentation amplifier is in the second configuration. At block 1645, input offsets of the second sub-circuit are compensated for using the second nulling current that was calibrated in block 1625. At block 1650, the second nulling current is optionally buffered, for example, using a cascode stage. Block 1655 involves calibrating the first nulling current in the first sub-circuit while the instrumentation amplifier is in the second configuration. In one embodiment, the first nulling current may be calibrated as described above with reference to FIG. 17, but is not limited as such.

At block 1660, the instrumentation amplifier is switched from the second configuration back to the first configuration. It should be appreciated that this process of switching between the amplification path provided by the first sub-circuit and the second sub-circuit may be repeated numerous times during the operation of instrumentation amplifier. Such continued switching allows for periodic recalibration of the nulling currents, which ensures that the output of the instrumentation amplifier is free of offset errors. Moreover, this ping-pong operation also ensures that the instrumentation amplifier continually has a path from input to output.

At block 1665, a high-frequency path, which may operate concurrently with the auto-zeroed low-frequency path, may be utilized to generate the output voltage. This path may be used, for example, at frequencies above a threshold frequency. In one embodiment, the high-frequency path is separate from the first sub-circuit and second sub-circuit of the instrumentation amplifier.

Thus, embodiments provide technology allowing for instrumentation amplifiers with very low input-referred offset, low input current, and low level spurious switching signals at the output. Moreover, some embodiments use a ping-pong architecture, which ensures that there is constantly an offset-free stage in the signal path, and no additional offset is thereby introduced due to aliasing. Additionally, spurious signals may be further reduced by adding a high-frequency feedforward path.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An instrumentation amplifier comprising:
   an output stage for generating an output voltage;
   a first input stage for sensing a differential input and generating a first intermediate current based thereon;
   a first feedback stage coupled with said first input stage and said output stage, said first feedback stage for generating a first feedback current based on said output voltage; and
   an auto-zeroing circuit coupled with said first input stage, said first feedback stage, and said output stage, said auto-zeroing circuit for generating a nulling current, wherein said nulling current compensates for errors in said first intermediate current and said first feedback current resulting from input offsets in said first input stage and said first feedback stage; and
a pre-charge circuit coupled with said first input stage, wherein said pre-charge circuit is operable to charge an input of said first input stage to a pre-charge voltage, wherein said pre-charge voltage is based on said differential input, and wherein said pre-charge circuit is operable to charge said input of said first input stage to said pre-charge voltage without loading said differential input.

2. The instrumentation amplifier as recited in claim 1 further comprising:
a current buffer stage coupled with said first input stage, said first feedback stage, said auto-zeroing circuit, and said output stage, said current buffer stage for buffering at least one of said first intermediate current, said first feedback current, and said nulling current; and
wherein said current buffer stage increases an input impedance observed at an input of said output stage.

3. The instrumentation amplifier as recited in claim 2 wherein said first input stage, said first feedback stage, and said auto-zeroing circuit comprises a high frequency path coupled with said output stage; and
further comprising a high-frequency path coupled with said output stage, wherein said high-frequency path dominates said low-frequency path at frequencies above a particular frequency, and wherein further said low-frequency path dominates said high-frequency path at frequencies below said particular frequency.

4. The instrumentation amplifier as recited in claim 3 wherein said high-frequency path comprises:
a second input stage coupled with said output stage, said second input stage for sensing said differential input and generating a second intermediate current based thereon; and
a second feedback stage coupled with said output stage, said second feedback stage for generating a second feedback current based on said output voltage.

5. The instrumentation amplifier as recited in claim 1 wherein said auto-zeroing circuit is operable to detect offset currents corresponding to input offsets of said input stage and said feedback stage generate a nulling current based on said detected offset currents.

6. The instrumentation amplifier as recited in claim 5 wherein said auto-zeroing circuit comprises:
an integrator coupled with said first input stage and said first feedback stage, said integrator being operable to detect said offset currents; and
a tranconductance amplifier coupled with said integrator, said tranconductance amplifier for generating said nulling current.

7. The instrumentation amplifier as recited in claim 1 wherein said auto-zeroing circuit comprises:
a plurality of switches coupled with said first input stage and said first feedback stage, wherein said plurality of switches are operable to short inputs of said first input stage to an input common mode voltage, and wherein further said plurality of switches are operable to short inputs of said first feedback stage to a feedback common mode voltage.

8. The instrumentation amplifier as recited in claim 7 wherein said plurality of switches are operable to temporality disconnect said first input stage and said first feedback stage from said output stage while said nulling current is calibrated.

9. The instrumentation amplifier as recited in claim 1 wherein said pre-charge circuit comprises a buffer.

10. An instrumentation amplifier comprising:
an output stage for generating an output voltage;
a low-frequency path coupled with said output stage, said low-frequency path comprising:
an input stage for sensing a differential input and generating a intermediate current based thereon;
a feedback stage coupled with said input stage and said output stage, said feedback stage for generating a feedback current based on said output voltage; and
an auto-zeroing circuit coupled with said input stage and said feedback stage, said auto-zeroing circuit for switching said instrumentation amplifier between an amplification configuration and an auto-zeroing configuration, wherein said auto-zeroing circuit is operable to detect offset currents corresponding to input offsets of said input stage and said feedback stage in said auto-zeroing configuration, and wherein further said auto-zeroing circuit is operable to generate a nulling current based on said detected offset currents in said amplification configuration;
a pre-charge circuit coupled with said input stage, wherein said pre-charge circuit is operable to charge an input of said input stage to a pre-charge voltage, wherein said pre-charge voltage is based on said differential input, and wherein said pre-charge circuit is operable to charge said input of said first input stage to said pre-charge voltage without loading said differential input; and
a high-frequency path coupled with said output stage, wherein said high-frequency path dominates said low-frequency path at frequencies above a particular frequency, and wherein further said low-frequency path dominates said high-frequency path at frequencies below said particular frequency.

11. The instrumentation amplifier as recited in claim 10 wherein, in said auto-zeroing configuration, said auto-zeroing circuit is operable to de-couple said output stage from said input stage and said feedback stage, to couple said input stage and said feedback stage with an auto-zero loop, to couple said input stage with a common mode input voltage, and to couple said feedback stage with a common mode feedback voltage.

12. The instrumentation amplifier as recited in claim 10 further comprising:
a current buffer stage coupled with said input stage, said feedback stage, said auto-zeroing circuit, and said output stage, said current buffer stage for buffering at least one of said intermediate current, said feedback current, and said nulling current.

13. A method comprising:
generating an intermediate current based on an input voltage of a current feedback instrumentation amplifier;
generating a feedback current based on an output voltage of a current feedback instrumentation amplifier, wherein said intermediate current and said feedback current comprise offset components corresponding to input offsets of an input stage and a feedback stage respectively;
generating a nulling current based on said offset components, wherein said nulling current compensates for said offset components; and
pre-charging said input stage with a buffered version of said input voltage prior to applying said input voltage to said input stage.

14. The method as recited in claim 13 further comprising:
applying a common mode input voltage to said input stage;
applying a common mode feedback voltage to said feedback stage; and measuring said offset components while said common mode input voltage and said common mode feedback voltage are applied to said input stage and said feedback stage.

15. The method as recited in claim 13 wherein generating said nulling current comprises:

switching said instrumentation amplifier from an amplification configuration to an auto-zero configuration;

measuring said offset components; and generating said nulling current based on the measuring of said offset components.

16. The method as recited in claim 15 wherein said switching comprises:

de-coupling said output stage from said input stage and said feedback stage;

coupling said input stage to a common mode input voltage; and coupling said feedback stage to a common mode feedback voltage.

17. The method as recited in claim 13 further comprising:

buffering said intermediate current, said feedback current and said nulling current.

18. The method as recited in claim 13 further comprising:

utilizing a high-frequency path to generate said output voltage at frequencies above a particular frequency.

* * * * *